United States Patent [19]

Kato

[11] Patent Number: 5,392,037
[45] Date of Patent: Feb. 21, 1995

[54] METHOD AND APPARATUS FOR ENCODING AND DECODING

[75] Inventor: Shiro Kato, Osaka, Japan

[73] Assignee: Matsushita Electric Industrial Co., Ltd., Osaka, Japan

[21] Appl. No.: 885,940

[22] Filed: May 20, 1992

[30] Foreign Application Priority Data

May 21, 1991 [JP] Japan .................................. 3-116008
Aug. 31, 1991 [JP] Japan .................................. 3-302847
Feb. 21, 1992 [JP] Japan .................................. 4-34659

[51] Int. Cl.⁶ .......................................... H03M 13/00
[52] U.S. Cl. ........................................ 341/67; 341/94; 341/76
[58] Field of Search .............. 341/94, 76, 67; 375/26, 375/27, 34

[56] References Cited

U.S. PATENT DOCUMENTS 5,034,965 7/1991 Kato .

OTHER PUBLICATIONS

"Draft (Revision 6) of the JPEG algorithm", JPEG-8-46, Jun. 23, 1990.
"An Experimental Study for a Home-Use Digiral VTR" by C. Yamamitsu, et al. IEEE Trans. CE-35 No. 3, Aug. 1989, pp. 450-457.

Primary Examiner—Sharon D. Logan
Attorney, Agent, or Firm—Lowe, Price, LeBlanc & Becker

[57] ABSTRACT

In an encoding side, an estimate of input data is generated. An estimation error which is equal to a difference between the estimate and the input data is calculated. The estimation error is classified, thereby generating a category index indicative of a category corresponding to the estimation error. The input data is divided by a divisor, and a remainder of a result of the dividing is generated. The divisor is equal to a given value which is greater than a difference between an upper limit value and a lower limit value defining a range of the category. The category index and the remainder are encoded into corresponding codes which are outputted. In a decoding side, input data is decoded into a category index and a remainder. An estimate is generated from previous output data. A divisor is generated in accordance with the category index. An offset is generated in accordance with the divisor and the estimate. The offset is equal to the divisor multiplied by an integer. The offset and the remainder are added, and thereby new output data is generated in accordance with the offset and the remainder. In the presence of a control signal, the estimate is generated by a prediction process which differs front a prediction process in an encoding side. In the presence of the control signal, the offset is generated so as to increase a correlation between output data and the estimate.

26 Claims, 6 Drawing Sheets

METHOD AND APPARATUS FOR ENCODING AND DECODING

BACKGROUND OF THE INVENTION

1. Field of the Invention

This invention relates to a method of efficient encoding which can reduce the total number of bits of recorded or transmitted data. This invention also relates to a method of related decoding. In addition, this invention relates to apparatus for efficient encoding and decoding.

2. Description of the Prior Art

Highly-efficient encoding is of various types, and some of encoding is based on the combination of two of the types. Systems for efficiently encoding image data and audio data are being standardized. The standardization of a system for efficiently encoding still image data is advanced by JPEG, a lower branch of International Standardization Organization (ISO), and is now nearly completed.

A description will now be given of a prior-art JPEG efficient encoding of the DCT (discrete cosine transform) type which is disclosed in "Draft (Version 6) of the JPEG algorithm", JPEG-8-R6, Jun. 24, 1990.

Input data is digital image data, that is, a sampled and quantized image signal. A frame represented by the image data is divided into blocks each having 8 by 8 pixels (8 pixels in a horizontal direction, and 8 pixels in a vertical direction), and the image data is rearranged into sets of data which correspond to the blocks respectively. This process is referred to as "blocking". The image data in each block is subjected to 8-degree discrete cosine transform (referred to as DCT hereinafter), generating a set of DCT coefficients corresponding to the image data. A set of DCT coefficients has one DC coefficient and 63 AC coefficients. Each DCT coefficient is quantized with a given quantization step size Q. In other words, each DCT coefficient is divided by Q, and the result of the division is rounded. The resultant quantized AC coefficients are two-dimensionally encoded into a Huffman code. The resultant quantized DC coefficient is predictively encoded.

The predictive encoding of a quantized DC coefficient will be described hereinafter. A quantized DC coefficient is represented by data Di (i=1, 2, 3, ..., and "i" denotes an order number of data which is equal to an order number of a related block). In the predictive encoding, an estimate (a prediction value) Pi is calculated from input data Dk which is previously encoded, and an estimation error (a prediction error) Si equal to the difference between the data Di and the estimate Pi is calculated and then the estimation error Si is encoded. Here, the letter "k" denotes an integer smaller than the integer "i". This prediction is of the 0-th order type and is executed on the basis of a previous value, and the immediately-preceding input data is used as the estimate.

The encoding of an estimation error (a prediction error) Si will be described hereinafter. One of preset categories identified by different numbers (category indexes) is selected in accordance with the value of an estimation error Si, and the identification number (the category index) corresponding to the selected category is encoded into a Huffman code. The category index corresponds to the information represented by higher bits of the estimation error. Lower bits of the estimation error are cut and taken out. The number L of these lower bits is determined by the category index. The lower bits of the estimation error are outputted subsequently to the category-index Huffman code. In this way, the estimation error is divided into higher-bit information and lower-bit information, and each of the higher-bit information and the lower-bit information is encoded. If L lower bits of an estimation error (a prediction error) are directly cut and taken out, duplicated code words occur in a positive side and a negative side respectively. Accordingly, in cases where an estimation error is negative, "1" is subtracted from the estimation error and then L lower bits of the result of the subtraction are cut and taken out.

According to a variable-length encoding procedure such as a Huffman encoding procedure, short code words are assigned to data having high probabilities of occurrence while long code words are assigned to data having small probabilities of occurrence, so that the total number of bits of generated code words can be reduced in time average. The variable-length encoding is highly efficient, and is reversible.

In image data and audio data, adjacent data are closely correlated so that an estimation error is close to "0" at a high probability. Thus, advanced highly-efficient encoding is enabled by assigning short code words to identification numbers (category indexes) for categories corresponding to estimation errors having small absolute values.

Such predictive encoding (one of highly-efficient encoding) has a problem as follows. A decoding side recovers decoded values through processes including a process of integrating or accumulating the estimation-error data outputted from an encoding side. Thus, if an error occurs in the signal transmitted from the encoding side to the decoding side due to noise or others, the affection by the error is accumulated and remains in the decoding side for a long time so that the propagation of the error is caused.

U.S. Pat. No. 5,034,965 discloses highly-efficient encoding in which data processing is executed block by block. In general, a large-scale circuit is required to implement such block-by-block data processing.

Variable-length encoding such as Huffman encoding is inherently efficient. In general variable-length encoding, input data is encoded into variable-length code words, and the data store region in a transmission format is stuffed with a bit sequence composed of the code words before data transmission is executed. FIG. 8 shows an example of the arrangement of variable-length code words in the data store region in a prior-art transmission format. As shown in FIG. 8, "n" variable-code words Ci (i=1, 2, 3, ..., n) are sequentially arranged in the data store region, and there is no open space between adjacent code words. In addition, the first code C1 extends from the starting edge of the data store region, and the last code word Cn is spaced from the ending edge of the data store region by an open area.

According to such variable-length encoding and related decoding, if an error occurs in the transmission of code words from an encoding side to a decoding side, the lengths of code words following the error can not be detected and also the boundaries between the code words following the error can not be detected. Thus, in the presence of an error, the code words following the error can not be accurately decoded. This problem is referred to as error propagation (see C. Yamamitsu, et al, "AN EXPERIMENTAL STUDY FOR A HOME- USE DIGITAL VTR", IEEE Trans. CE-35, No. 3, Aug. 1989, pp 450-457).

SUMMARY OF THE INVENTION

It is a first object of this invention to provide an improved method of efficient encoding.

It is a second object of this invention to provide an improved method of decoding.

It is a third object of this invention to provide an improved apparatus for efficient encoding.

It is a fourth object of this invention to provide an improved apparatus for decoding.

A first aspect of this invention provides a method of efficient encoding which comprises the steps of generating an estimate of input data; calculating an estimation error which is equal to a difference between the estimate and the input data; classifying the estimation error and generating a category index indicative of a category corresponding to the estimation error; dividing the input data by a divisor and generating a remainder of a result of the dividing, the divisor being equal to a given value which is greater than a difference between an upper limit value and a lower limit value defining a range of the category; and encoding the category index and the remainder into corresponding codes and outputting the codes.

A second aspect of this invention provides a method of decoding which comprises the steps of decoding input data into a category index and a remainder; generating an estimate from previous output data; generating a divisor in accordance with the category index; generating an offset in accordance with the divisor and the estimate, the offset being equal to the divisor multiplied by an integer; and adding the offset and the remainder and thereby generating new output data in accordance with the offset and the remainder; wherein the estimate-generating step comprises the sub step of, in the presence of a control signal, generating the estimate by a prediction process which differs from a prediction process in an encoding side, and wherein the offset-generating step comprises the sub step of, in the presence of the control signal, generating the offset so as to increase a correlation between output data and the estimate.

A third aspect of this invention provides a method of efficient encoding which comprises the steps of collecting a given number of bits of input data into a block; subjecting the input data in a block to given transform and thereby generating a DC coefficient and AC coefficients from the input data in a block; quantizing the DC coefficient into data D; encoding the data D into Coded DC data; quantizing the AC coefficients; and encoding results of quantizing the AC coefficients into Coded AC data: wherein the data-D encoding step comprises the sub steps of generating an estimate of the data D, generating an estimation error which is equal to a difference between the data D and the estimate, classifying the estimation error and generating a category index indicative of a category corresponding to the estimation error, determining a divisor in accordance with the category corresponding to the estimation error, dividing the data D by the divisor and generating a remainder of a result of the dividing, and encoding the category index and the remainder and thereby generating the Coded DC data in accordance with the category index and the remainder.

A fourth aspect of this invention provides a method of decoding which comprises the steps of decoding Coded AC data into quantized AC coefficients; decoding Coded DC data into a quantized DC coefficient; dequantizing the quantized AC coefficients into AC coefficients; dequantizing the quantized DC coefficient into a DC coefficient; subjecting the AC coefficients and the DC coefficient to inverse transform and thereby generating first decoded data in a block in accordance with the AC coefficients and the DC coefficient; and rearranging the first decoded data in a block into second decoded data which has a data arrangement corresponding to a data arrangement of input data to be encoded in an encoding side; wherein the Coded-DC-data decoding step comprises the sub steps of decoding the Coded DC data into a category index and a remainder, generating an estimate in accordance with decoded quantized data, generating a divisor in accordance with the category index, generating an offset in accord;race with the divisor and the estimate, the offset being equal to the divisor multiplied by an integer, adding the offset and the remainder and thereby generating new quantized data in accordance with the offset and the remainder; wherein the estimate-generating step comprises the sub step of, in the presence of a control signal, generating the estimate by a prediction process which differs from a prediction process in an encoding side, and wherein the offset-generating step comprises the sub step of, in the presence of the control signal, generating the offset so as to increase a correlation between decoded data in a block being currently decoded and decoded data in an error-free block adjoining the block being currently decoded.

A fifth aspect of this invention provides a method of efficient encoding which comprises the steps of encoding input data into a variable-length code, and arranging the variable-length code into a data store region of a given capacity and outputting the variable-length code, the improvement comprising the steps of encoding the input data into variable-length code words each having a first portion and a second portion, wherein the first portion includes a bit pattern which can determine a code length of the related word, and wherein the second portion is equal to a part of the related word except the first portion; collecting the first portions into a group and arranging the group of the first portions into the data store region; and collecting the second portions into a group and arranging the group of the second portions into the data store region.

A sixth aspect of this invention provides an apparatus for efficient encoding which comprises means for generating an estimate of input data; means for calculating an estimation error which is equal to a difference between the estimate and the input data; means for classifying the estimation error and generating a category index indicative of a category corresponding to the estimation error; means for dividing the input data by a divisor and generating a remainder of a result of the dividing, the divisor being equal to a given value which is greater than a difference between an upper limit value and a lower limit value defining a range of the category; and means for encoding the category index and the remainder into corresponding codes and outputting the codes.

A seventh aspect of this invention provides an apparatus for decoding which comprises means for decoding input data into a category index and a remainder; means for generating an estimate from previous output data; means for generating a divisor in accordance with the category index; means for generating an offset in accordance with the divisor and the estimate, the offset being equal to the divisor multiplied by an integer; and means for adding the offset and the remainder and thereby generating new output data in accordance with the offset and the remainder; wherein the estimate-generating means comprises means for, in the presence of a control signal, generating the estimate by a prediction process which differs from a prediction process in an encoding side, and wherein the offset-generating means comprises means for, in the presence of the control signal, generating the offset so as to increase a correlation between output data and the estimate.

An eighth aspect of this invention provides an apparatus for efficient encoding which comprises means for collecting a given number of bits of input data into a block; means for subjecting the input data in a block to given transform and thereby generating a DC coefficient and AC coefficients from the input data in a block; means for quantizing the DC coefficient into data D; means for encoding the data D into Coded DC data; means for quantizing the AC coefficients; and means for encoding results of quantizing the AC coefficients into Coded AC data; wherein the data-D encoding means comprises means for generating an estimate of the data D, means for generating an estimation error which is equal to a difference between the data D and the estimate means for classifying the estimation error and generating a category index indicative of a category corresponding to the estimation error, means for determining a divisor in accordance with the category corresponding to the estimation error, means for dividing the data D by the divisor and generating a remainder of a result of the dividing, and means for encoding the category index and the remainder and thereby generating the Coded DC data in accordance with the category index and the remainder.

A ninth aspect of this invention provides an apparatus for decoding which comprises means for decoding Coded AC data into quantized AC coefficients; means for decoding Coded DC data into a quantized DC coefficient; means for dequantizing the quantized AC coefficients into AC coefficients; means for dequantizing the quantized DC coefficient into a DC coefficient; means for subjecting the AC coefficients and the DC coefficient to inverse transform and thereby generating first decoded data in a block in accordance with the AC coefficients and the DC coefficient; and means for rearranging the first decoded data in a block into second decoded data which has a data arrangement corresponding to a data arrangement of input data to be encoded in an encoding side; wherein the Coded-DC-data decoding means comprises means for decoding the Coded DC data into a category index and a reminder, means for generating an estimate in accordance with decoded quantized data, means for generating a divisor in accordance with the category index, means for generating an offset in accordance with the divisor and the estimate, the offset being equal to the divisor multiplied by an integer, means for adding the offset and the remainder and thereby generating new quantized data in accordance with the offset and the remainder; wherein the estimate-generating means comprises means for, in the presence of a control signal, generating the estimate by a prediction process which differs from a prediction process in an encoding side, and wherein the offset-generating means comprises means for, in the presence of the control signal, generating the offset so as to increase a correlation between decoded data in a block being currently decoded and decoded data in an error-free block adjoining the block being currently decoded.

A tenth aspect of this invention provides an apparatus for efficient encoding which comprises means for encoding input data into a variable-length code, and means for arranging the variable-length code into a data store region of a given capacity and outputting the variable-length code, the improvement comprising means for encoding the input data into variable-length code words each having a first portion and a second portion, wherein the first portion includes a bit pattern which can determine a code length of the related word, and wherein the second portion is equal to a part of the related word except the first portion; means for collecting the first portions into a group and arranging the group of the first portions into the data store region; and means for collecting the second portions into a group and arranging the group of the second portions into the data store region.

DESCRIPTION OF THE FIRST PREFERRED EMBODIMENT

Figure 1A:
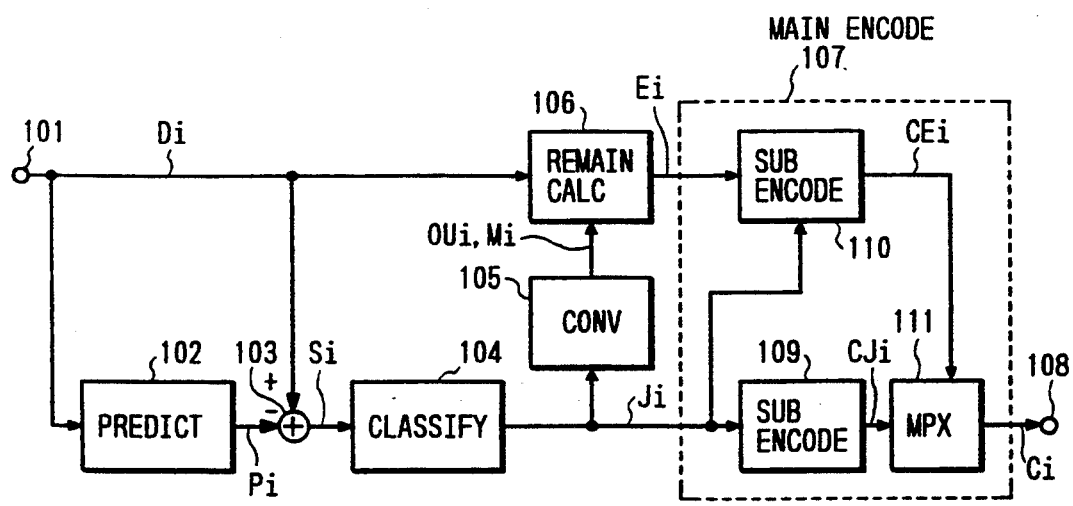
FIG. 1(a) is a block diagram of an efficient encoding apparatus which uses an efficient encoding method according to a first embodiment of this invention.

According to a first embodiment of this invention, a method of efficient encoding executes a sequence of processing steps 1–4 as follows.

1. An estimate (a prediction value) Pi for actual input data Di (an unsigned integer) is obtained. The estimate Pi is subtracted from the actual input data Di, thereby calculating an estimation error (a prediction error) Si. It should be noted that Di denotes an i-th input data. In the following description, reference characters with the adscript "i" denote data corresponding to the input data Di.

2. The estimation error Si is classified in accordance with the value thereof by referring to a given classification table. Specifically, a decision is made regarding which of rages (categories) the estimation error Si is present in. The category index (the category number) Ji denoting the range or the category where the estimation error Si is present is determined. When the upper limit value and the lower limit value of the estimation error range corresponding to the category index Ji are represented by SXi and SNi respectively, the following relation is satisfied.

$$SNi \leq Si \leq SXi \qquad (1)$$

Furthermore, a calculation is given of divisor data OUi which corresponds to the category index Ji in a one-to-one manner, and which satisfies the following relation, $$OUi > SXi - SNi \qquad (2)$$

3. The input data Di is divided by the divisor data OUi, and the remainder Ei is calculated according to modulo operation. Thus, the following equation is satisfied.

$$Di = Ni \cdot OUi + Ei \qquad (3)$$

where Ni denotes the quotient.

4. The category index Ji and the remainder data Ei are encoded.

An example of the classification table used in the above-mentioned processing step 1 is shown in the following.

TABLE 1

| CATEGORY INDEX Ji | ESTIMATION ERROR RANGE (SN ~ SX) | | DIVISOR DATA OUi | REMAINDER DATA WORD LENGTH Mi |
|---|---|---|---|---|
| | SNi | SXi | | |
| −8 | −255 | −128 | 128 | 7 |
| −7 | −127 | −64 | 64 | 6 |
| −6 | −63 | −32 | 32 | 5 |
| −5 | −31 | −16 | 1 | 4 |
| −4 | −15 | −8 | 8 | 3 |
| −3 | −7 | −4 | 4 | 2 |
| −2 | −3 | −2 | 2 | 1 |
| −1 | −1 | −1 | 1 | 0 |
| 0 | 0 | 0 | 1 | 0 |
| 1 | 1 | 1 | 1 | 0 |
| 2 | 2 | 3 | 2 | 1 |
| 3 | 4 | 7 | 4 | 2 |
| 4 | 8 | 15 | 8 | 3 |
| 5 | 16 | 31 | 16 | 4 |
| 6 | 32 | 63 | 32 | 5 |
| 7 | 64 | 127 | 64 | 6 |
| 8 | 128 | 255 | 128 | 7 |

Table 1 shows the category indexes Ji, the corresponding estimation error ranges (SNi−SXi), the corresponding divisor data OUt, and the word lengths Mi of the remainder data Ei.

As is made clear from the above description, in the efficient encoding method of the first embodiment of this invention, the category index which is higher-bit information of the estimation error is encoded and also the remainder data which is lower-bit information of the input data is encoded before they are transmitted.

In cases where input data Di represents a signed integer, the efficient encoding method of the first embodiment of this invention is carried out provided that the input data Di is previously subjected to code conversion into a corresponding unsigned integer.

Next, a description will be given of a decoding method according to the first embodiment of this invention. As described previously, in the efficient encoding method of the first embodiment of this invention, the category index Ji and the remainder data Ei are encoded and are then transmitted. As understood from the equation (3), the data Di can be recovered in accordance with the divisor data Oui, the remainder data Ei, and the quotient data Ni. The category index Ji and the divisor data Oui correspond to each other in a one-to-one manner. Thus, a table of the conversion from category indexes to divisor data is previously prepared, and the divisor data Oui is calculated from the transmitted category index Ji by referring to the data conversion table. The remainder data Ei is transmitted. Accordingly, the data Di is obtained provided that the quotient data Ni is calculated.

The quotient data Ni is calculated as follows. The relation (1) and the equation (3) are combined to eliminate the term of the estimation error Si, and the following relation is obtained.

$$Pi + Sni \leq Di \leq Pi + SXi \qquad (4)$$

The relation (4) and the equation (3) are combined to eliminate the term of the data Di, and the following relation is obtained.

$$(Pi + SNi - Ei)/OUi \leq Ni \leq (Pi + SXi - Ei)/OUi \qquad (5)$$

The estimate Pi is calculated from the previously-recovered data Dk, where "k" denotes an integer smaller than the integer "i". Each of values SXi and SNi corresponds to a category index Ji in a one-to-one manner. Thus, a table of the conversion from category indexes to data SXi and SNi is previously prepared, and the values SXi and SNi are calculated from the category index Ji by referring to the data conversion table. Since the quotient data Ni denotes an integer and the difference "(SXi−SNi)/OUi" between the left-hand term and the right-hand term of the relation (5) is smaller than 1 as understood from the relation (2), the quotient data Ni which satisfies the relation (5) could be uniquely determined. Accordingly, the quotient data Ni is determined by calculating the smallest integer which satisfies the following left-hand portion of the relation (5).

$$(Pi + SNi - Ei)/OUi \leq Ni \qquad (6)$$

The quotient data Ni may also be determined by calculating the greatest integer which satisfies the following right-hand portion of the relation (5).

$$Ni \leq (Pi + SXi - Ei)/OUi \qquad (7)$$

In this way, the quotient data Ni can be calculated by using either of the relations (5), (6), and (7). Since the calculation of the quotient data Ni which uses the relation (7) allows omitting the figures below the decimal point from the result of the division in the right-hand side of the relation (7), this calculation can be easily carried out.

The determined quotient data Ni is substituted for the corresponding term of the equation (3), and therefore the data Di is obtained. In other words, the data Di is recovered by the decoding process.

In summary, the decoding method of the first embodiment of this invention executes a sequence of processing steps 1–5 as follows.

1. The transmitted codes (data) are decoded into the category index Ji and the remainder data Ei.
2. The estimate Pi is calculated from the previously-recovered data Dk, where "k" denotes an integer smaller than the integer "i".
3. The upper limit value SXi or the lower limit value SNi of the estimation error range (the category) is calculated from the category index Ji and the divisor data OUi.
4. The quotient data Ni is calculated by referring to the relation (5), the relation (6), or the relation (7).
5. The data Di is calculated by referring to the equation (3).

Since the value represented by the remainder data Ei is smaller than the value represented by the divisor data OUi, the code length Mi of the remainder data Ei corresponds to the bit number equal to "$\log_2 OUi$". To minimize the code length Mi, that is, to enhance the encoding efficiency, it is good that the smallest value which satisfies the relation (2) is used as the divisor data OUi. In cases where divisor data OUi is designed so as to correspond to a power of 2, hardware for executing the division and the calculation of the remainder can be simplified. Furthermore, in these cases, since the code length Mi corresponds to an integer, the remainder data Ei can be efficiency binary-coded. Thus, it is preferable that divisor data, and upper limit values and lower limit values of estimation errors are designed so as to satisfy the following equation.

$$OUi = 2^{Mi} = SXi - NI + 1 \tag{8}$$

Values in Table 1 for the prediction-error classification are chosen so that the equation (8) can be satisfied in the case where input data Di has an 8-bit word length.

FIG. 1(a) shows an efficient encoding apparatus which uses the efficient encoding method according to the first embodiment of this invention. With reference to FIG. 1(a), an input terminal 101 is subjected to input data Di to be encoded. The input data Di results from sampling and quantizing a video signal or an image signal. The input data Di represents an unsigned integer which can vary in the range of 0 to 255.

As shown in FIG. 1(a), the efficient encoding apparatus includes a prediction circuit 102, a subtraction circuit 103, a classification circuit 104, a data conversion circuit 105, a remainder calculation circuit 106, a main encoding circuit 107, a sub encoding circuit 109, a sub encoding circuit 110, and a multiplexing circuit 111.

The prediction circuit 102 serves to generate an estimate (a prediction value) Pi. The subtraction circuit 103 subtracts the estimate Pi from the input data Di, thereby generating an estimation error (a prediction error) Si. The classification circuit 104 receives the estimation error Si and outputs a category index Ji. The data conversion circuit 105 generates divisor data OUi in response to the category index Ji. The remainder calculation circuit 106 divides the data Di by the divisor data OUi, thereby generating remainder data Ei according to modulo operation. The main encoding circuit 107 encodes the category number Ji and the remainder data Ei into coded data Ci. The coded data Ci is transmitted through an output terminal 108. The main encoding circuit 107 includes the sub encoding circuits 109 and 110, and the multiplexing circuit 111. The sub encoding circuit 109 encodes the category index Ji into coded data CJi. The sub encoding circuit 110 encodes the remainder data Ei into coded data CEi. The multiplexing circuit 111 combines the coded data CJi and the coded data CEi into the multiplexed coded data Ci.

The efficient encoding apparatus of FIG. 1(a) operates as follows. The input data Di is fed via the input terminal 101 to the prediction circuit 102, the subtraction circuit 103, and the remainder calculation circuit 106. The prediction circuit 102 executes 0-th order prediction using a previous value. The prediction circuit 102 includes a register which holds the immediately-preceding data Di−1. The prediction circuit 102 generates an estimate (a prediction value) Pi from the immediately-preceding data Di−1 by referring to the equation "Pi=Di−1".

The subtraction circuit 103 subtracts the prediction circuit Pi from the input data Di, thereby generating an estimation error (a prediction error) Si which is represented by the equation "Si=Di−Pi". The classification circuit 104 receives the estimation error Si, and classifies the estimation error Si in accordance with the magnitude thereof by referring to Table 1. Specifically, the classification circuit 104 decides one of the categories (ranges) in which the estimation error Si is present by referring to Table 1. The classification circuit 104 outputs a category index Ji corresponding to the category (range) in which the estimation error Si is present. The data conversion circuit 105 includes a ROM (a read only memory), generating divisor data OUi and code length data Mi in response to the category index Ji by referring to Table 1. The data conversion circuit 105 outputs the divisor data OUi and the code length data Mi to the remainder calculation circuit 106. The remainder calculation circuit 106 divides the input data Di by the divisor data OUi, generating related remainder data Ei according to modulo operation. In the design of Table 1, since the divisor data OUi represents the Mi-th power of 2, the remainder calculation circuit 106 can be formed by a simple gate circuit which takes out Mi lower bits of the input data Di. In this case, it is good that the data conversion circuit 105 outputs the data Mi instead of the divisor data OUi.

The sub encoding circuit 109 in the main encoding circuit 107 encodes the category index Ji into a Huffman code (one of entropy codes). The sub encoding circuit 109 outputs the Huffman code in a bit serial format. The output signal from the sub encoding circuit 109 is the coded data CJi. The probability of the occurrence of an estimation error (a prediction error) corresponding to a category index Ji is approximately equal to the probability of the occurrence of an estimation error (a prediction error) corresponding to a category index −Ji. Accordingly, in this embodiment, equal Huffman codes are assigned to categories corresponding to opposite-sign category indexes, and a 1-bit flag G denoting either of the categories is added to the Huffman code to form the coded data CJi. The flag G is designed as follows. When the category index Ji is "0", the flag G is unnecessary. In addition, the flag G being "0" represents that the related category index Ji is positive, while the flag G being "1" represents that the related category index Ji is negative.

The sub encoding circuit 110 in the main decoding circuit 107 determines a bit number Mi of tile remainder data Ei in accordance with the category index Ji by referring to Table 1. The sub encoding circuit 110 outputs Mi lower bits of the remainder data Ei in a bit serial format. The output signal from the sub encoding circuit 110 is the coded data CEi. The reason why only the Mi lower bits of the remainder data Ei are outputted is that the remainder data Ei can be represented by Mi bits.

The multiplexing circuit 111 in the main encoding circuit 107 adds the coded data CEi to the end of the coded data CJi, thereby combining the coded data CEi and the coded data CJi into the multiplexed coded data Ci. The multiplexing circuit 111 outputs the multiplexed coded data Ci in a bit serial format, which is transmitted via the output terminal 108.

As will be described hereinafter, exceptional data processing is done when the absolute value of the category index Ji is equal to 8. When the estimation error Si is equal to the maximum value 255, the corresponding category index Ji is equal to 8. When the estimation error Si is equal to the minimum value $-255$, the corresponding category index Ji is equal to $-8$. In these cases, the word length Mi of the remainder data Ei is equal to 7 as indicated in Table 1. Thus, the resultant of the addition of the 1-bit flag G to the remainder data Ei has a word length of 8 bits which is equal to that of the input data Di. In these cases, the efficiency of the direct transmission of the input data Di is equal to that of the transmission of the resultant of encoding the input data Di, and the direct transmission of the input data Di is better than the transmission of the resultant of encoding the input data Di from the standpoint of the occurrence of a transmission error. In view of this fact, in this embodiment, when the absolute value of a category number Ji is equal to 8, the MSB (most significant bit) of input data Di is outputted as the flag G. Therefore, when the absolute value of a category index Ji is equal to 8, the flag G denotes the MSB of input data Di and remainder data Ei denotes the seven lower bits of the input data Di so that the input data Di of the 8-bit word length is directly transmitted. It should be noted that, when the absolute value of a category index Ji is equal to 8, the codes of a flag G and remainder data Ei may be transmitted as in the case where the absolute value of the category index Ji is different from 8.

Figure 1B:
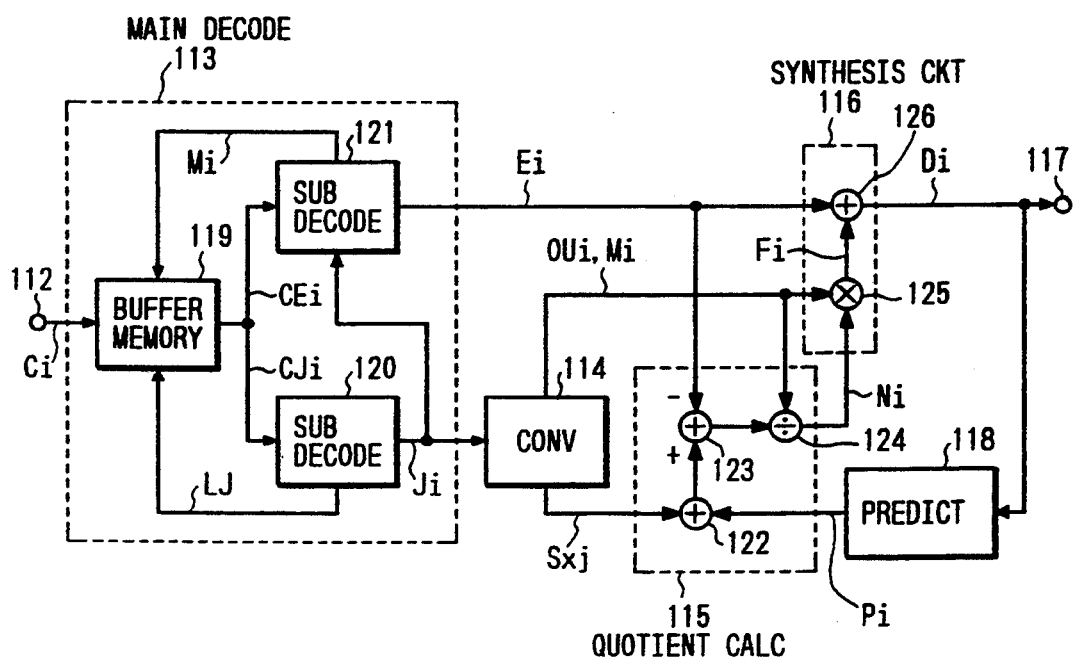
FIG. 1(b) is a block diagram of a decoding apparatus which uses a decoding method according to the first embodiment of this invention.

FIG. 1(b) shows a decoding apparatus which uses the decoding method according to the first embodiment of this invention. With reference to FIG. 1(b), an input terminal 112 is subjected to coded data Ci which is transmitted directly or indirectly from the efficient encoding apparatus of FIG. 1(a).

As shown in FIG. 1(b), the decoding apparatus includes a main decoding circuit 113, a data conversion circuit 114, a quotient data calculation circuit 115, a synthesis circuit 116, a prediction circuit 118, a buffer memory 119, a sub decoding circuit 120, a sub decoding circuit 121, an addition circuit 122, a subtraction circuit 123, a division circuit 124, a multiplication circuit 125, and an addition circuit 126.

The coded data Ci is fed to the main decoding circuit 113 via the input terminal 112. The main decoding circuit 113 decodes the coded data Ci into a category index Ji and remainder data Ei. The data conversion circuit 114 generates the upper limit value SXi of a category (an estimation error range) and divisor data OUi in accordance with the category index Ji, The quotient data calculation circuit 115 generates quotient data Ni from the upper limit SXi of the estimation error range, and outputs the quotient data Ni. The synthesis circuit Di recovers data Di in accordance with the divisor data OUi, the quotient data Ni, and the remainder data Ei. The recovered data Di is transmitted via an output terminal 117. The prediction circuit 118 calculates an estimate (a prediction value) Pi for the data Di from previously-recovered data Dk, where "k" denotes an integer smaller than the integer "i". The main decoding circuit 113 includes the buffer memory 119, the sub decoding circuit 120, and the sub decoding circuit 121. The buffer memory 119 receives the coded data Ci via the input terminal 112, and temporarily stores the coded data Ci. The sub decoding circuit 120 receives the coded data CJi from the buffer memory 119. The coded data CJi is contained in a head of the coded data Ci. The sub decoding circuit 120 decodes the coded data CJi into a category index Ji. The sub decoding circuit 121 receives the coded data CEi from the buffer memory 119. The coded data CEi is contained in the portion of the coded data Ci except the head thereof. The sub decoding circuit 121 decodes the coded data CEi into a remainder data Ei. The quotient data calculation circuit 115 includes the addition circuit 122, the subtraction circuit 123, and the division circuit 124. The addition circuit 122 adds the upper limit value SXj of the estimation error range and the estimate Pi. The subtraction circuit 123 subtracts the remainder data Ei from the output data of the addition circuit 122. The division circuit 124 divides the output data of the subtraction circuit 123 by the divisor data OUi, and outputs only the integer part of the result of the division as the quotient data Ni. The synthesis circuit 116 includes the multiplication circuit 125 and the addition circuit 126. The multiplication circuit 125 multiplies the divisor data OUi and the quotient data Ni, thereby generating offset data Fi. The addition circuit 126 combines the offset data Fi and the remainder data Ei into the recovered data Di.

The decoding apparatus of FIG. 1(b) operates as follows. The coded data Ci fed via the input terminal 112 is temporarily stored in the buffer memory 119 in the main decoding circuit 113. The sub decoding circuit 120 in the main decoding circuit 113 reads out the coded data CJi from the buffer memory 119 and decodes the coded data CJi into the category index Ji while deciding the code word length LJ thereof. The buffer memory 119 receives the code word length LJ. In the buffer memory 119, the position of a starting edge of the coded data CEi following the coded data CJi is determined in accordance with the code word length LJ, and the starting edge position is set in a reading pointer.

The sub decoding circuit 121 in the main decoding circuit 113 receives the category index Ji from the sub decoding circuit 120, and calculates the code length Mi of the remainder data Ei from the category index Ji by referring to Table 1. The sub decoding circuit 121 reads out the coded data CEi from the buffer memory 119 which has a code length corresponding to Mi bits. The sub decoding circuit 121 adds the data "0" to the higher edge of the coded data CEi, decoding the coded data CEi into the remainder data Ei of a bit parallel format.

The buffer memory 119 receives the word length Mi from the sub decoding circuit 121, and calculates the position of the starting edge of the coded data CJi following the coded data CEi on the basis of the received word length Mi. The buffer memory 119 updates the reading pointer In accordance with the calculated position of the starting edge of the coded data CJi to make preparations for the decoding of subsequent data.

The data conversion circuit 114 includes a ROM, and generates and outputs the upper limit value SXi of the estimation error range and the divisor data OUi in accordance with the category index Ji by referring to Table 1.

The quotient data calculation circuit 115 executes the calculation in the right-hand side of the equation (7) while using the remainder data Ei, the upper limit value SXi, and the estimate Pi. The estimate Pi is fed from the prediction circuit 18. The quotient data calculation circuit 115 outputs the integer part of the result of the executed calculation, that is, the quotient data Ni.

The synthesis circuit 116 receives the quotient data Ni, the divisor data OUi, and the remainder data Ei. The synthesis circuit 116 executes the calculation of the equation (3) in response to the quotient data Ni, the divisor data OUi, and the remainder data Ei, and thereby recovers the data Di. The synthesis circuit 116 outputs the recovered data Di, which is transmitted via the output terminal 117.

The structure of the prediction circuit 118 is similar to the structure of the prediction circuit 102 in the efficient encoding apparatus of FIG. 1(a). The prediction circuit 118 receives the recovered data Di. The prediction circuit 118 calculates the estimate Pi from the previously-recovered data Dk, where "k" denotes an integer smaller than the integer "i".

As described previously, when the absolute value of the category index Ji is equal to 8, the input data Di is directly outputted from the efficient encoding apparatus of FIG. 1(a) as the exceptional data processing. Specifically, during the exceptional data processing, the 1-bit flag G is added to the higher-bit side of the 7-bit data Ei, and thus the flag G and the remainder data Ei are combined. The combination of the flag G and the remainder data Ei is regarded as the input data Di, and is outputted from the sub decoding circuit 121 in the decoding apparatus of FIG. 1(b) via the synthesis circuit 116 without undergoing any data change. In this case, since the estimate Pi is unnecessary in the decoding, error propagation in the output signal from the decoding apparatus of FIG. 1(b) can be cancelled or removed during this exceptional data processing.

The operation of the efficient encoding apparatus of FIG. 1(a) will be further described. It is now assumed that input data Di which will be coded next represents 46, and that the immediately-preceding input data Di−1 which has been decoded represents 35.

In the efficient encoding apparatus of FIG. 1(a), the prediction circuit 102 outputs the estimate Pi equal to 35 since Pi=Di−1. The subtraction circuit 103 generates the estimation error Si equal to 11 since Si=Di−Di−1. The classification circuit 104 generates the category index Ji equal to 4 in accordance with the estimation error Si equal to 11 by referring to Table 1.

The data conversion circuit 105 generates the divisor data Oui and the code length data Mi in accordance with the category index Ji by referring to Table 1. The divisor data Oui corresponds to a power of 2, and the code length data Mi corresponds to the integer part thereof. The remainder calculation circuit 106 divides the data Di by the divisor data Oui, and outputs the related remainder data Ei according to modulo operation. Since $OUi = 2^{Mi} = 8$, the remainder data Ei corresponds to 6. Since the divisor data Oui corresponds to a power of 2, the execution of normal division is unnecessary and the remainder data Ei can be obtained by taking out the Mi lower bits of the data Di. Here, the data Mi represents 3.

The sub decoding circuit 109 converts the category index Ji into the Huffman code. It is now assumed that the Huffman code denoting Ji=4 or Ji=−4 is equal to a 3-bit-length binary number expressed as "101". It should be noted that a numeral in the double quotation marks means a binary code hereinafter. The code CJi which results from encoding the category index Ji=4 is "1010". The code CJi is outputted from the sub decoding circuit 109 in a bit serial format. The last 1-bit data "0" of the code CJi, that is, the 1-bit data "0" added to the end of the 3-bit-length binary number "101", is the flag G denoting the sign of the category index Ji. Here, the flag G being "0" means that the category index Ji is positive.

The sub encoding circuit 110 selects the Mi lower bits of the remainder data Ei, and outputs the selected Mi lower bits as the encoded data CEi. Since Ei=6 and Mi=3, the three lower bits "110" of the remainder data Ei are outputted as the encoded data CEi. The multiplexing circuit 111 adds the encoded data CEi being "110" to the end of the encoded data CJi being "1010", and thereby generates and outputs the encoded data Ci being "1010110". The encoded data Ci is transmitted in a bit serial format via the output terminal 108.

In the decoding apparatus of FIG. 1(b), the coded data Ci fed via the input terminal 112 is temporally stored in the buffer memory 119 in the main decoding circuit 113. The coded data Ci stored in the buffer memory 119 is in a bit serial format. It is assumed that the recovery of tile data Di−1=35 has been completed and the decoding of the coded data Ci will be started to recover the data Di.

The sub decoding circuit 120 in the main decoding circuit 113 reads out the coded data CJi from the region of the buffer memory 119 which has addresses starting from the address denoted by the reading pointer in the buffer memory 119. Reading out the coded data CJi is executed in a bit serial format. When a former portion of the coded data Ci which is equal to "101" has been read out, the sub decoding circuit 120 can detect that the code length LJ of the coded data CJi is equal to 4 bits. In cases where the category index Ji is different from 0, the sub decoding circuit 120 reads out the added 1-bit flag G from the buffer memory 119. In this way, all the 4-bit coded data CJi="1010" is read out. Since the flag G being "0" represents that the category index Ji is positive, the sub decoding circuit 120 outputs the category index Ji being 4.

The sub decoding circuit 121 in the main decoding circuit 113 receives the category index Ji=4 from the sub decoding circuit 120, and calculates the code length Mi of the remainder data Ei from the category index Ji by referring to Table 1. Since Ji=4, Mi=3. The sub decoding circuit 121 reads out the coded data CEi which has a code length corresponding to Mi bits, that is, 3 bits. Thus, the coded data CEi="110" is obtained. The sub decoding circuit 121 changes the serial-form coded data CEi into corresponding parallel-form coded data. Specifically, the sub decoding circuit 121 adds the 5-bit data "00000" to the higher-bit side of the coded data CEi="110", thereby recovering the 8-bit parallel data Ei representative of a decimal value of 6. The sub decoding circuit 121 outputs the 8-bit parallel data Ei. It should be noted the reading pointer in the buffer memory 119 is updated to a new value which denotes the memory address corresponding to the starting edge of a region of the buffer memory 119 which stores the subsequent coded data Ci+1.

The data conversion circuit 114 generates and outputs the upper limit value SXi of the estimation error rage, the divisor data OUi, and the code length Mi in accordance with the category index Ji by referring to Table 1. Since Ji=4, SXi=15 and OUi=8. In addition, Mi=3. The code length Mi agrees with the exponential part of the divisor data OUi.

The quotient data calculation circuit 115 receives the estimate Pi from the prediction circuit 118. The quotient data calculation circuit 115 adds the estimate Pi and the upper limit value SXi, and subtracts the remainder data Ei from the result of the addition. Sine Pi=−Di−1=35 and SXI=15, the result of the addition is equal to 50. Since Ei=6, the result of the subtraction is equal to 44. Then, the quotient data calculation circuit 115 divides the result of the subtraction by the divisor data OUi, thereby generating the quotient data Ni. Since OUi=2Mi=8, the quotient data Ni corresponds to 5. The quotient data calculation circuit 115 outputs the quotient data Ni to the synthesis circuit 116.

The synthesis circuit 116 multiplies the quotient data Ni and the divisor data OUi, thereby generating the offset data Fi. Since Ni=5 and OUi=8, Fi=40. The synthesis circuit 116 adds the offset data Fi and the remainder data Ei, thereby recovering the data Di. Since Ei=6, Di=46. The synthesis circuit 116 outputs the recovered data Di, which is transmitted via the output terminal 117.

Since the divisor data OUi corresponds to a power of 2, it is unnecessary for the division circuit 124 to execute normal division. Specifically, in the division circuit 124, the quotient data Ni is obtained by removing the Mi lower bits of the data Di. Here, Mi=3. Furthermore, it is unnecessary for the multiplication circuit 125 to execute normal multiplication. Specifically, in the multiplication circuit 125, the offset data Fi being equal to the multiplication result is obtained by adding "0" of the Mi bits to the lower side of the quotient data Ni. The remainder data Ei is applied to a first input terminal of the addition circuit 126. The portion of the remainder data Ei except the Mi lower bits is "0". The offset data Fi is applied to a second input terminal of the addition circuit 126. Each of the Mi lower bits of the offset data Fi is "0". Thus, it is unnecessary for the addition circuit 126 to execute normal addition. Specifically, in the addition circuit 126, the Mi lower bits of the offset data Fi are replaced by the Mi lower bits of the remainder data Ei. Therefore, the division circuit 124, the multiplication circuit 125, and the addition circuit 126 can be combined into a composite circuit of a simple structure. Specifically, the composite structure serves to replace the Mi lower bits of the output signal from the addition circuit 123 by the Mi lower bits of the remainder data Ei, and serves to output the resultant as the decoded data Di.

A consideration will now be given of the case where the decoding result related to the immediately-preceding data Di−1=36 is erroneously equal to 31, corresponding to a relatively small error, due to a transmission error. Since Pi=Di−1, error propagation occurs in a prior-art decoding apparatus in this case. On the other hand, in the decoding method of the embodiment of this invention, the decoding result related to the data Di is accurately equal to 46 and thus error propagation does not occur. The reason for this fact is in the following. The quotient data Ni is calculated for the decoding by referring to the equation (5), the equation (6), or the equation (7). The accurate quotient data Ni is obtained even when there is a certain error between the estimate Pi used in the equations (5)–(7) and the estimate used in the encoding. According to the equation (7), in the case where Di=46, the correct quotient data Ni=5 is obtained for the estimate Pi in the range of 31 to 38.

As described previously, this embodiment prevents error propagation, and this embodiment is advantageous from the standpoint of error-propagation suppressing characteristics. The divisor data is designed so as to correspond to a power of 2, and thereby the encoding apparatus and the decoding apparatus according to this embodiment can be formed by circuits comparable in scale to circuits constituting a prior-tort encoding apparatus and a prior-art decoding apparatus.

While the Mi lower bits of the remainder data are cut and taken out before being directly outputted during the encoding of the remainder data in this embodiment, the remainder data may be encoded into another code.

While this embodiment executes the reversible encoding, the irreversible encoding may be done as follows. For example, in the case where the estimation error is large, lower bits of the remainder data Ei are rounded and the resultant is transmitted. In the irreversible encoding and the related decoding a local decoder is provided in an encoding apparatus and an estimate is generated from the output data of the local decoder to equalize the estimate in the encoding apparatus and an estimate in a decoding apparatus. In this embodiment, a similar local decoder may be provided in the encoding apparatus.

DESCRIPTION OF THE SECOND PREFERRED EMBODIMENT

Firstly, the background of a second embodiment of this invention will be explained hereinafter.

In the case where the decoded value used for the estimation has a significantly large error due to a transmission error, the estimation in the decoding apparatus provides the estimate Pi having a large error since the estimation in the decoding is similar to the estimation in the encoding apparatus. Thus, in this case, it is difficult to obtain the accurate decoded value. The encoding apparatus which executes the following modified estimation can provide the correct decoded value. The modified estimation uses another decoded value which is independent of a transmission error, so that the modified estimation can provide an estimate Pi' having only a small error. According to the efficient encoding method of this embodiment, the higher bit information (the category index Ji) of the estimation error and the lower bit information (the remainder data Ei) of the input data are encoded before being transmitted. Provided that a single unknown number represented by the quotient data Ni is derived, the correct decoded data Di is obtained. Especially, in the case where the divisor data OUi represents a large value, the range in which the quotient data Ni is present is narrow so that the decision thereof is done easily.

The decoding method using the estimate Pi' will now be described. It is assumed that coded dam is equal to coded data Ci outputted from the efficient decoding apparatus of FIG. 1(a).

Input data to be decoded corresponds to an image signal. During the decoding, 0-th order prediction is executed in a horizontal direction of the image to provide an estimate Pi. The image signal generally has a correlation in two-dimensional directions (three-dimensional directions including a time-base direction in the case of a moving image). For example, in the case where current input data Di is closely correlated with the 1-line preceding data Di-H (H denotes the number of pixels in one line), that is, in the case where a close vertical correlation is present, an estimate Pi' which has only a small error can be obtained by executing 0-th order prediction in the vertical direction and by setting the estimate Pi' equal to Di-H. Thus, in the case where the estimate Pi' having only a small error is obtained as described previously, the correct data Di can be recovered at a high probability by executing the following processes. Quotient data Ni is set so that an error between data Di and an estimate Pi' will be small. Calculation is given of the value Ni which satisfies the following relation.

$$|Ni \cdot OUi + Ei - Pi'| < |(Ni+G) \cdot OUi + Ei - Pi'| \qquad (9)$$

where G denotes an arbitrary integer other than 0. Then, the calculated value Ni is placed into the equation (3) to recover the data Di.

Accordingly, a decoding apparatus capable of withstanding a transmission error can be realized by detecting the transmission error and by executing the decoding while referring to the equations (3) and (9) only in the case where the data Di which enables the generation of the small-error estimate Pi' is detected.

Figure 2:
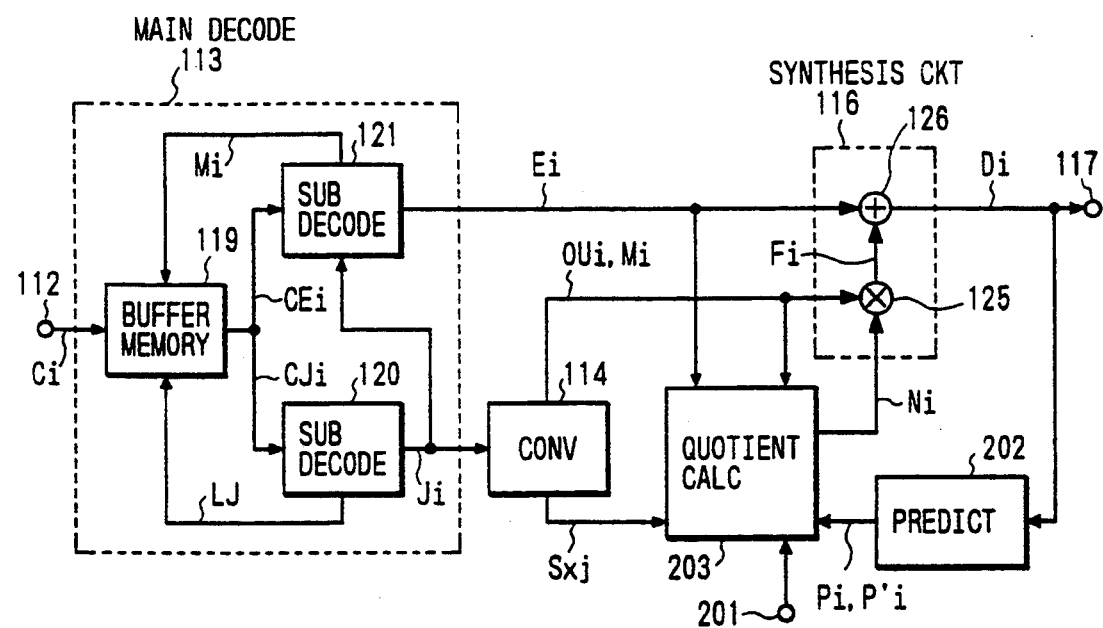
FIG. 2 is a block diagram of a decoding apparatus which uses a decoding method according to the second embodiment of this invention.

The second embodiment of this invention will now be explained in detail. The second embodiment of this invention is similar to the first embodiment of this invention except for design changes described later. FIG. 2 shows a decoding apparatus which uses a decoding method according to the second embodiment of this invention. With reference to FIG. 2, an input terminal 112 is subjected to coded data Ci which is transmitted directly or indirectly from the efficient encoding apparatus of FIG. 1(a).

The decoding apparatus of FIG. 2 includes a prediction circuit 202 and a quotient data calculation circuit 203 instead of the prediction circuit 118 and the quotient data calculation circuit 115 of FIG. 1(b). Sections of the decoding apparatus of FIG. 2 which are similar in structure to the corresponding sections of the decoding apparatus of FIG. 1(b) are denoted by the same reference numerals, and detailed description of these sections will be omitted.

Figure 3A:
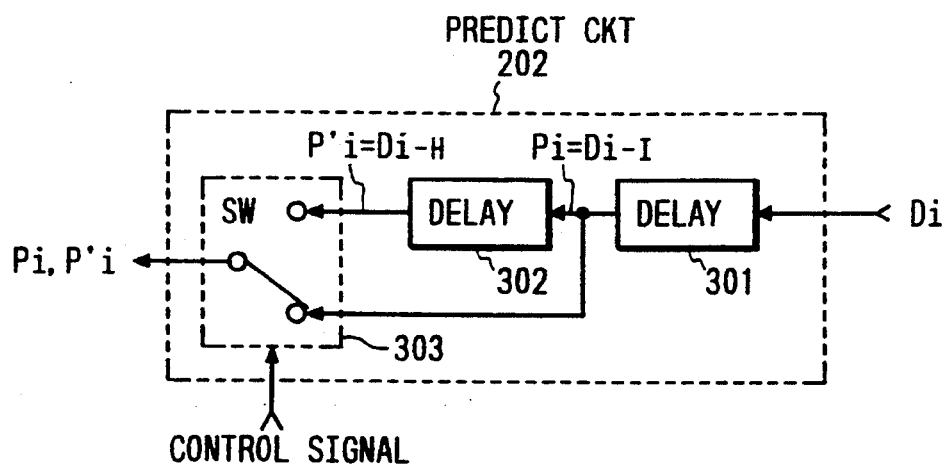
FIG. 3(a) is a block diagram of the prediction circuit of FIG. 2.

FIG. 3(a) shows the internal structure of the prediction circuit 202. As shown in FIG. 3(a), the prediction circuit 202 includes delay circuits 301 and 302, and a switch 303. The delay circuit 301 includes a register for holding the decoded data which immediately precedes the current data to be decoded. The delay circuit 301 provides a data delay of one stage to the decoded data Di. The delay circuit 302 provides a data delay of (H−1) stages to the output data from the delay circuit 301. In the absence of an active control signal, the switch 303 selects the output data from the delay circuit 301 and outputs the selected data as an estimate Pi. In the presence of the active control signal, the switch 303 selects the output data from the delay circuit 302 and outputs the selected data as an estimate Pi'.

In normal cases where an active control signal is absent, since the switch 303 outputs the horizontal-direction estimate Pi=Di−1 which is equal to the output estimate from the prediction circuit 118 in the encoding apparatus of FIG. 1(a), the prediction circuit 202 operates similarly to the prediction circuit 118. In the presence of an active control signal, the prediction circuit 202 executes the vertical-direction 0-th order estimation different from the estimation executed by the prediction circuit 118 in the encoding apparatus of FIG. 1(a), and the prediction circuit 202 outputs the estimate Pi'=Di−H.

Figure 3B:
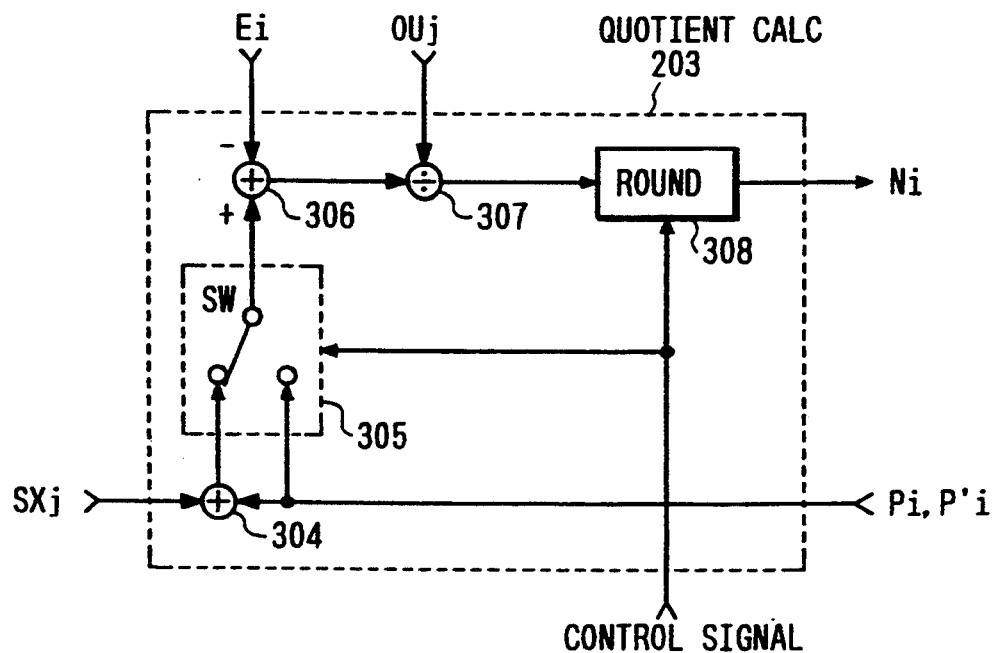
FIG. 3(b) is a block diagram of the quotient data calculation circuit of FIG. 2.

FIG. 3(b) shows the internal structure of the quotient data calculation circuit 203. As shown in FIG. 3(b), the quotient data calculation circuit 203 includes an addition circuit 304, a switch 305, a subtraction circuit 306, a division circuit 307, and a rounding circuit 308. The addition circuit 304 adds the upper limit value SXi of the estimation error range and the estimate Pi fed from the prediction circuit 202. In the absence of the active control signal, the switch 305 selects the output data from the addition circuit 304, and outputs the selected data. In the presence of the active control signal, the switch 305 selects the estimate Pi' fed from the prediction circuit 202, and outputs the selected estimate Pi'. The subtraction circuit 306 subtracts the remainder data Ei from the output data of the switch 305. The division circuit 307 divides the output data from the subtraction circuit 306 by the divisor data Oui. In the absence of the active control signal, the rounding circuit 308 subjects the output data from the division circuit 307 to a rounding-down process. In the presence of the active control signal, the rounding circuit 308 subjects the output data from the division circuit 307 to a half-adjusting process (counting fractions over ½ as one and disregarding the rest).

In the absence of the active control signal, the estimate obtained by the prediction circuit 202 is equal to the value Pi as in the encoding apparatus of FIG. 1(a), so that the addition circuit 306 receives the output data from the addition circuit 304 via the switch 305. In addition, the rounding circuit 308 executes the rounding-down process. Therefore, the processing is done which is similar to the processing executed by the quotient data calculation circuit 115 of FIG. 1(b). In the presence of the active control signal, the estimate obtained by the prediction circuit 202 agrees with the value Pi' which results from the vertical-direction prediction, and the addition circuit 306 receives the estimate Pi' via the switch 305. In addition, the rounding circuit 308 executes the half-adjusting process. Therefore, the rounding circuit 308 outputs the quotient data Ni which minimizes the error between the coded data Di and the estimate Pi', that is, which satisfies the equation (9).

The synthesis circuit 116 of FIG. 2 executes the calculation of the equation (1) in response to the quotient data Ni outputted from the quotient data calculation circuit 203, and thereby generates the recovered data Di. The synthesis circuit 116 outputs the recovered data Di.

As described previously, according to this embodiment, only in the case where a transmission error could cause large-error decoded data and where estimation different from the estimation in the encoding is able to generate a small-error estimate Pi', the decoding different from the decoding of the first embodiment is done and specifically the decoding is clone by setting the quotient data Ni so as to be closely correlated with the estimate Pi'. Therefore, the decoding is accurately done at a higher probability, and it is possible to more reliably withstand an error.

A consideration will now be given of data Dr which exists between Data Dm suffering a transmission error and data Di recovered in response to the previously-mentioned control signal, where "m" and "r" denote natural numbers having the relation "m<r<i". Such data Dr can be accurately recovered by a decoding process using the data Di in a direction of reducing the number "r", that is, a reverse direction. By modifying this embodiment so as to also execute this decoding process, it is possible to further contract an error propagation region.

Specifically, the reverse-direction decoding, that is, the decoding from data Di+1 to data Di, is executed as follows. First, the quotient data Ni is calculated so as to satisfy the following relation.

$$SNi+1 \leq Di+1-(OUi \cdot Ni+Ei) \leq SXi+1 \tag{10}$$

There is a relation as follows.

$$OUi \cdot Ni+Ei=Di=Pi+1$$

The data Di is calculated from the quotient data Ni, the divisor data Oui, and the transmitted remainder data Ei by referring to the equation (3). It should be noted that the divisor data Oui is generated on the basis of the category index Ji.

The active control signal is generated by a suitable circuit (not shown) such as a circuit for detecting a transmission error or a circuit for deciding a data correlation.

The correlation deciding circuit may be of one of various types. For example, the correlation deciding circuit is of the vertical correlation type which has a simple structure including a comparator for comparing a category index Ji-H and a category index Ji. It should be noted that when the data Di and the data Di-H have a close correlation, the estimation error Si and the estimation error Si-H generally have a close correlation also and therefore the category index Ji and the category index Ji-H tend to be equal.

DESCRIPTION OF THE THIRD PREFERRED EMBODIMENT

Figure 4A:
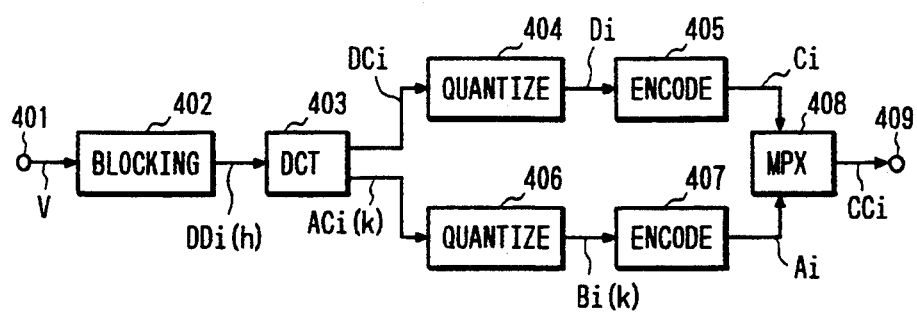
FIG. 4(a) is a block diagram of an efficient encoding apparatus which uses an efficient encoding method according to a third embodiment of this invention.

FIG. 4(a) shows an efficient encoding apparatus which uses an efficient encoding method according to a third embodiment of this invention. With reference to FIG. 4(a), an input terminal 401 is subjected to input data V to be encoded. The input data V results from sampling and quantizing a video signal or an image signal.

As shown in FIG. 4(a), the efficient encoding apparatus includes a blocking circuit 402, a DCT circuit 403, a quantization circuit 404, an encoding circuit 405, a quantization circuit 406, an encoding circuit 407, and a multiplexing circuit 408.

The efficient encoding apparatus of FIG. 4(a) operates as follows. The input image data V is fed via the input terminal 401 to the blocking circuit 402. The blocking circuit 402 rearranges the input image data V so that a frame represented by the input data V will be separated into rectangular regions, that is, blocks, each having 8×8 pixels (8 pixels in a horizontal direction and 8 pixels in a vertical direction). The blocking circuit 402 outputs data DDi(h) which corresponds to each block, where "h" denotes an integer of 0 to 63. The DCT circuit 403 receives the block data DDi(h) from the blocking circuit 402. The DCT circuit 403 subjects the block data DDi(h) to 8-degree DCT in each of the horizontal direction and the vertical direction, transforming the block data DDi(h) into a set of DCT coefficients including one DC coefficient DCi and 63 AC coefficients ACi(k), where "i" denotes a block identification number and "k" denotes an integer of 1 to 63.

The DCT circuit 403 outputs the DC coefficient DCi to the quantization circuit 404. The DCT circuit 403 outputs the AC coefficients ACi(k) to the quantization circuit 406. The quantization circuit 404 quantizes the DC coefficient DCi with a given quantization step size Qd, thereby converting the DC coefficient DCi into data Di. Specifically, the quantization circuit 404 divides the DC coefficient DCi by the quantization step size Qd, and rounds the result of the division. The encoding circuit 405 encodes the data Di into coded data Ci. The encoding circuit 405 is similar in structure to the encoding apparatus of FIG. 1(a). It should be noted that the signal inputted into the encoding circuit 405 is different from the signal inputted into the encoding apparatus of FIG. 1(a). Specifically, the signal inputted into the encoding circuit 405 is the data which results from quantizing the DC coefficient (equal to a mean value) of a block having 8×8 pixels, while the signal inputted into the encoding apparatus of FIG. 1(a) is the data which results from quantizing image data. To make clear the correspondence between the encoding circuit 405 and the encoding apparatus of FIG. 1(a), this description uses the reference character Di which is the same as that in FIG. 1(a). The quantization circuit 406 quantizes the AC coefficients ACi(k) with given quantization step sizes Qai(k), thereby converting the AC coefficients ACi(k) into data Bi(k). The quantization step sizes Qai(k) are predetermined for AC coefficients ACi(k) respectively. The encoding circuit 407 receives the data Bi(k) from the quantization circuit 406, and subjects the data Bi(k) to two-dimensional Huffman encoding and thereby encodes the data Bi(k) into coded data Ai. The multiplexing circuit 408 receives the coded data Ci from the encoding circuit 405. In addition, the multiplexing circuit 408 receives the coded data Ai from the encoding circuit 407. The multiplexing circuit 408 combines the coded data Ci and the coded data Ai into multiplexed coded data CCi. The multiplexing circuit 408 outputs the coded data CCi, which is transmitted via an output terminal 409.

Figure 4B:
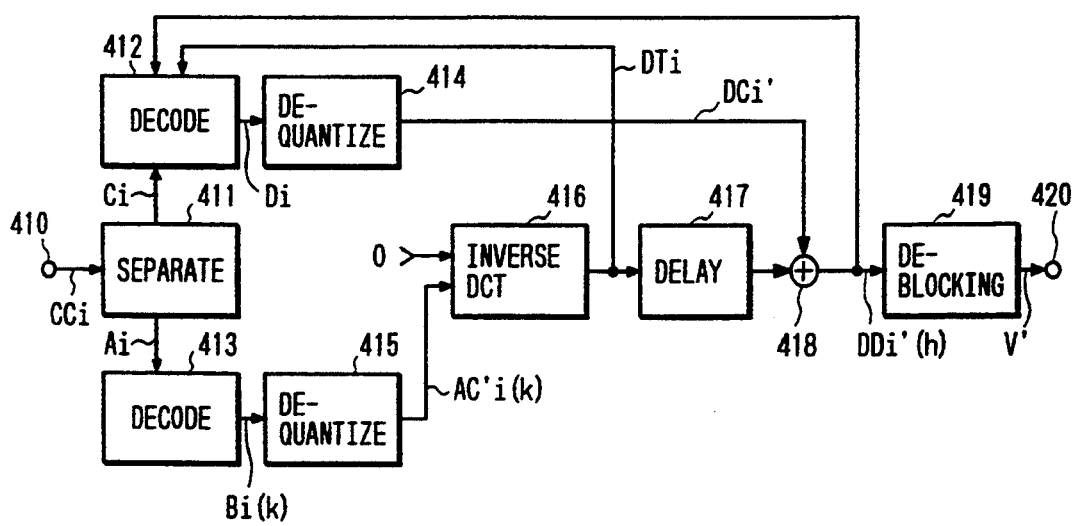
FIG. 4(b) is a block diagram of a decoding apparatus which uses a decoding method according to the third embodiment of this invention.

FIG. 4(b) shows a decoding apparatus which uses a decoding method according to the third embodiment of this invention. With reference to FIG. 4(b), an input terminal 410 is subjected to coded data CCi which is transmitted directly or indirectly from the efficient encoding apparatus of FIG. 4(a).

As shown in FIG. 4(b), the decoding apparatus includes a separation circuit 411, a decoding circuit 412, a decoding circuit 413, a dequantization circuit 414, a dequantization circuit 415, an inverse DCT circuit 416, a delay circuit 417, an addition circuit 418, and a deblocking circuit 419. The separation circuit 411 separates the coded data CCi into coded data Ci and coded data Ai. The decoding circuit 412 decodes the coded data Ci into data Di. The decoding circuit 413 decodes the coded data Ai into data Bi(k). The dequantization circuit 414 multiplies the data Di by the quantization step size Qd, thereby executing dequantization of the data Di and recovering DC coefficient data DCi' from the data Di. The dequantization circuit 415 multiplies the data Bi(k) by the given quantization step sizes Qai(k) respectively, thereby executing dequantization of the data Bi(k) and recovering AC coefficient data ACi'(k) from the data Bi(k). The inverse DCT circuit 416 executes transform inverse with respect to the DCT transform executed by the DCT circuit 403 of FIG. 4(a). The delay circuit 417 operates on the output data from the inverse DCT circuit 416, and provides timing adjustment. The addition circuit 418 adds the recovered data DCi' and the output data from the delay circuit 417, thereby generating recovered image data DDi'(h) corresponding to a block. The deblocking circuit 419 rearranges the block-corresponding image data DDi', thereby generating recovered image data V' having a data arrangement equal to the data arrangement which occurs before the encoding. The deblocking circuit 419 outputs the recovered image data V', which is transmitted via an output terminal 420.

The operation of the decoding apparatus of FIG. 4(b) will now be further described. The coded data CCi is fed via the input terminal 410 to the separation circuit 411. The separation circuit 411 separates the coded data CCi into coded data Ci and coded data Ai. The separation circuit 411 outposts the coded data Ci to the decoding circuit 412. The separation circuit 411 outputs the coded data Ai to the decoding circuit 413. The coded data Ai is represented by the two-dimensional Huffman code. The decoding circuit 413 decodes the coded data Ai into decoded data which agrees with quantized AC coefficients Bi(k). The dequantization circuit 415 multiplies the data Bi(k) by the given quantization step sizes Qai(k) respectively, thereby executing dequantization of the data Bi(k) and recovering AC coefficients ACi'(k) from the data Bi(k). The inverse DCT circuit 416 receives the AC coefficients ACi'(k) from the dequantization circuit 415. The inverse DCT circuit 416 receives data representing a value of "0". The inverse DCT circuit 416 executes inverse DCT while setting a DC coefficient equal to an interim value of "0" and setting AC coefficients equal to the received AC coefficients ACi'(k) respectively. The inverse DCT generates interim recovered data (AC coefficient data) DTi corresponding to a block. The inverse DCT circuit 416 outputs the interim recovered data DTi to the delay circuit 417 and the decoding circuit 412.

The decoding circuit 412 is basically similar in internal structure to the decoding apparatus of FIG. 2, and the drawing which shows the entire structure of the decoding circuit 412 will be omitted. The decoding circuit 412 differs from the decoding apparatus of FIG. 2 in that the decoding circuit 412 includes a prediction circuit of FIG. 5 instead of the prediction circuit 202 of FIG. 3(a). During normal decoding without a transmission error, the prediction circuit in the decoding circuit 412 executes a process similar to the process executed by The prediction circuit 118 of FIG. 1(b) or the prediction circuit 202 of FIG. 2. Specifically, the prediction circuit in the decoding circuit 412 outputs an estimate Pi equal to immediately-preceding recovered data Di−1 as in the encoding process. It should be noted that the data Di−1 represents the DC coefficient of a recovered (i−1)-th block which lies adjacently leftward of an i-th block. On the other hand, in the case where a large error is detected and an active control signal is fed to the prediction circuit in the decoding circuit 412, the decoding circuit executes estimation different from that executed in the encoding process, and thereby outputs an estimate Pi'.

The estimate Pi' is calculated from data in an (i-H)-th block which lies adjacently and directly above a currently-decoded i-th block. As in the second embodiment, it may be good that the estimate Pi' is equal to the quantized DC coefficient Di-H of the (i-H)-th block. Here, "H" denotes the total number of blocks in a frame along the horizontal direction. In this embodiment, to enhance the accuracy of an estimate, the estimate Pi' is calculated from data of pixels in the recovered (i-H)-th block.

The estimate Pi' for the quantized DC coefficient Di is calculated as follows. Since the eight uppermost pixels in the i-th block are closest to the eight lowermost pixels in the (i-H)-th block, accurate estimates pi(q) for the data DDi'(q) of the eight uppermost pixels in the i-th block can be obtained from the data DDi-H'(q) of the eight lowermost pixels in the (i-H)-th block. Here, $q=q1, q2, \ldots, q8$. The data DDi'(q) of the eight uppermost pixels in the i-th block can be represented by the sum of the AC coefficients DTi(q) and the DC coefficient DCi' of the block. Here, $DCi'=Di \cdot Qd$. The letter "d" is now introduced as an indication of an error, that is, a difference between the pixel data DOi'(q) and the pixel data estimate pi(q). The following relation is satisfied.

$$Di = \{pi(q) - DTi(q) - d\}/Qd \tag{11}$$

Since the error "d" is generally small, the estimate Pi' for the quantized DC coefficient Di can be approximately expressed by the following equation.

$$Pi' = \{pi(q) - DTi(q)\}/Qd \tag{12}$$

In this embodiment, to simplify the structure of the prediction circuit in the decoding circuit 412, 0-th order prediction in the vertical direction is executed to generate the estimates pi(q). Specifically, the recovered data DDi-H'(q) of the eight lowermost pixels in the (i-H)-th block are used as the estimates pi(q) respectively. As described previously, the eight lowermost pixels in the (i-H)-th block adjoin the eight uppermost pixels in the i-th block which have the image data DDi'(q), where $q=q1, q2, \ldots, q8$. According to the equation (12), the average among the values "pi(q)−DTi(q)" for the eight difference "q" is calculated and the average is divided by the quantization step size Qd, and the result of the division is set as the estimate Pi' for the quantized DC coefficient. This averaging process enhances the accuracy of the prediction. It may also be good that the estimate Pi' is determined by executing the calculation of the equation (12) for one "q".

Figure 5:
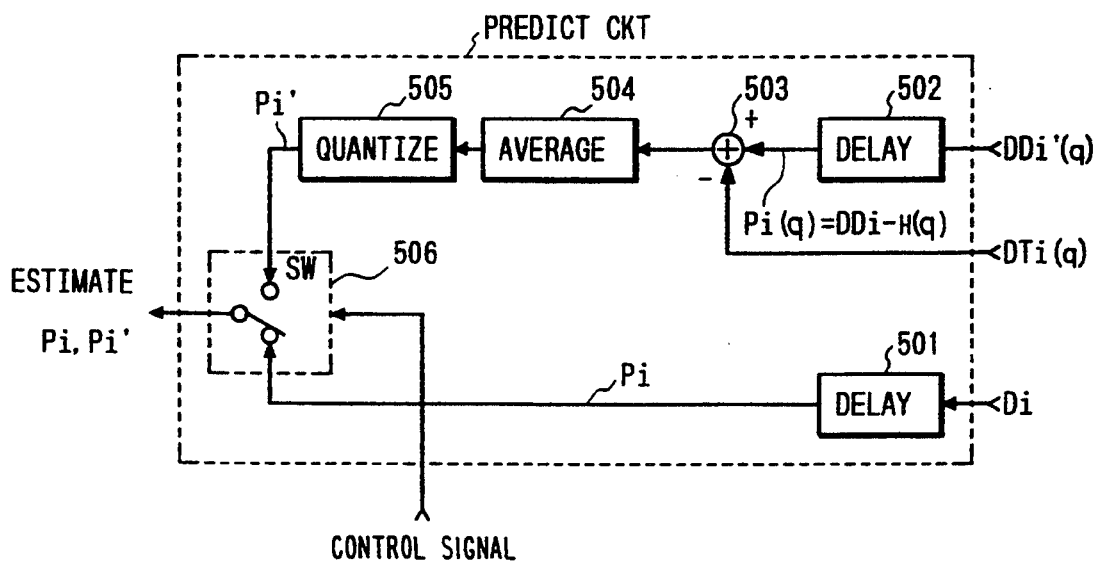
FIG. 5 is a block diagram of a prediction circuit in one of the decoding circuits in FIG. 4(b).

FIG. 5 shows the prediction circuit for generating the estimate Pi'. As shown in FIG. 5, the prediction circuit includes a delay circuit 501, a delay circuit 502, a subtraction circuit 503, an averaging circuit 504, a quantization circuit 505, and a switch 506. The delay circuit 501 receives data Di, and outputs immediately-preceding data Di−1 as an estimate Pi. The delay circuit 502 receives recovered data DDi', and outputs an estimate $pi(q)=DDi-H'(q)$. The subtraction circuit 503 calculates the difference between the estimate pi(q) and data DTi(q). The averaging circuit 504 outputs the average among the differences for $q=1, 2, \ldots, 8$ which are outputted from the subtraction circuit 504. The quantization circuit 505 divides the average by the quantization step size Qd to execute quantization, thereby generating and outputting an estimate Pi'. In normal cases where an active control signal is absent, the switch 506 selects and outputs the estimate Pi. In the presence of the active control signal, the switch 506 selects and outputs the estimate Pi'.

The above-mentioned structure and operation of the decoding circuit 412 enables the generation of recovered data Di which has only a small error even during the presence of a transmission error. The generation of the estimate Pi' requires the recovery of the AC coefficients and the inverse DCT to be executed prior to the recovery of the DC coefficient. To realize this timing relation, the decoding circuit 412 includes a timing-adjustment delay circuit (not shown).

Returning to FIG. 4(b), the dequantization circuit 414 receives the data Di from the decoding circuit 412. The dequantization circuit 414 multiplies the data Di by the quantization step size Qd, thereby generating DC coefficient data DCi'. The dequantization circuit 414 outputs the DC coefficient data DCi' to the addition circuit 418. The delay circuit 417 delays the data DTi, and thereby executes timing adjustment. The delay circuit 417 outputs the delayed data DTi to the addition circuit 418. The addition circuit 418 adds and combines the data DTi and the data DCi' into recovered image data DDi' which corresponds to a block. The addition circuit 418 outputs the block-corresponding data DDi' to the deblocking circuit 419. The deblocking circuit 419 rearranges the block-corresponding image data. DDi'(h), thereby generating recovered image data V' having a data arrangement equal to the data arrangement which occurs before the encoding. The deblocking circuit 419 outputs the recovered image data V', which is transmitted via the output terminal 420.

As described previously, according to this embodiment, even when recovered data Di having a large error is caused by a transmission error, the correlation between data of pixels in adjacent blocks is used and thereby the correct recovered value of image data can be obtained at a high probability. Thus, this embodiment can more reliably withstand an error relative to a prior-art apparatus.

The prediction may be of other types. The entropy encoding may use arithmetic encoding or others. While the AC coefficients agree with the result of DCT in this embodiment other design may be adopted. In this invention, the correlation between AC components is used in the generation of an estimate. It should be noted that DCT may be replaced by other transform such as DFT, KL transform, or transform including average value separation vector quantization.

DESCRIPTION OF THE FOURTH PREFERRED EMBODIMENT

Figure 6A:
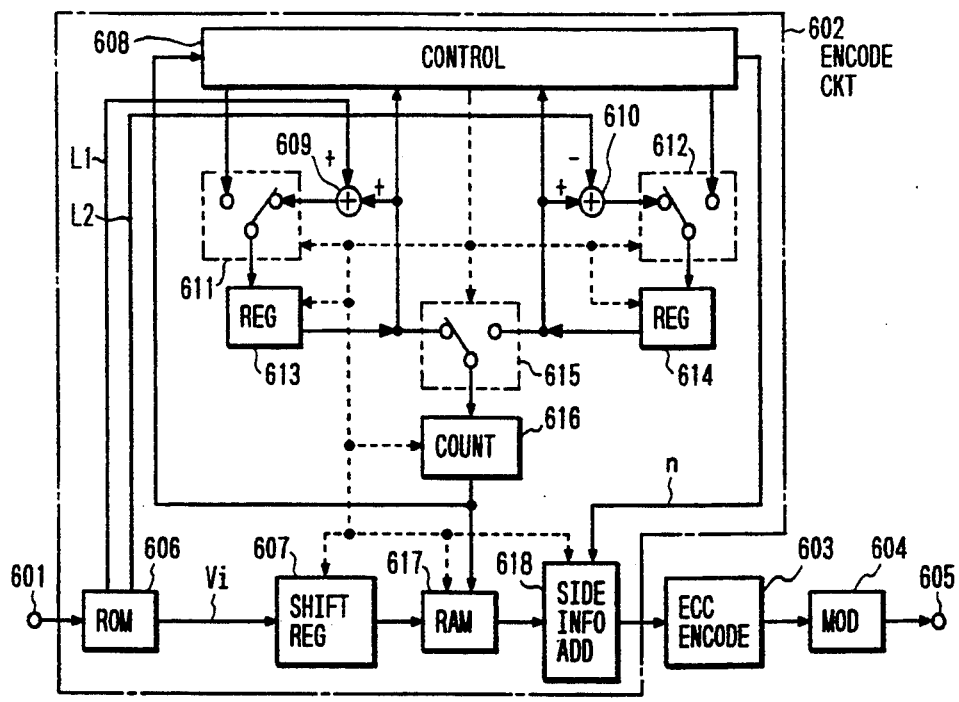
FIG. 6(a) is a block diagram of a transmitter using an efficient encoding method according to a fourth embodiment of this invention.

FIG. 6(a) shows a transmitter using an efficient encoding method according to a fourth embodiment of this invention. With reference to FIG. 6(a), an input terminal 601 is subjected to input data Di to be transmitted.

As shown in FIG. 6(a), the transmitter includes an encoding circuit 602, an ECC encoder 603, and a modulation circuit 604. The encoding circuit 602 encodes the input data Di into a variable-length code, and places the variable-length code in a data store region within a data transmission format. The ECC encoder 603 adds an error correction code to the output data from the encoding circuit 602. The modulation circuit 604 modulates the output data from the ECC encoder 603. The output signal from the modulation circuit 604 is fed via an output terminal 605 to a transmission line (not shown).

The encoding circuit 602 includes a ROM (a read only memory) 606, a shift register 607, a control circuit 608, an addition circuit 609, a subtraction circuit 610, a selection circuit 611, a selection circuit 612, a register 613, a register 614, a selection circuit 615, a counter 616, a RAM (a random access memory), and a side information adding circuit 618. The ROM 606 outputs bit-parallel-format data Vi of a variable length code word Ci corresponding to the input data Di, and word length data L1 and L2 corresponding to the input data Di. The data Vi has a fixed word length which is equal to the maximum length of the variable-length code. The shift register 607 receives the data Vi, converting the data Vi into a bit serial format and outputting the resultant bit-serial-format data. The selection circuits 611 and 612 are controlled by the control circuit 608. Each of the selection circuits 611 and 612 selects and outputs one of two input signals. The counter 616 receives the output signal from the selection circuit 615 as a preset signal. The counter 616 is controlled by the control circuit 608, incrementing or decrementing a count value by 1. The RAM 617 receives the output signal from the shift register 607 as a written signal. The RAM 617 receives the output signal from the counter 616 as an address signal. The side information adding circuit 618 adds side information to the output signal from the RAM 617.

The transmitter of FIG. 6(a) operates as follows. The input data Di to be transmitted is fed via the input terminal 601 to the encoding circuit 602. The encoding circuit 602 encodes the input data Di into variable-length code words, which are sequentially arranged in one or more data store regions within a transmission format. Thus, the variable-length code words are converted into bit-serial-format data, which are outputted from the encoding circuit 602.

The ECC encoder 603 receives the output data from the encoding circuit 602. The ECC encoder 603 adds the ECC (the error correction code) to the output data from the encoding circuit 602. The modulation circuit 604 receives the output data from the ECC encoder 603. The modulation circuit 604 modulates the output data from the ECC encoder 603. The output signal from the modulation circuit 604 is fed via the output terminal 605 to the transmission line.

The operation of the encoding circuit 602 will now be described in more detail. As described previously, the encoding circuit 602 encodes the input data Di into the variable-length code word Ci, and locates the variable-length code word Ci in the data store region within the data transmission format.

Figure 7:
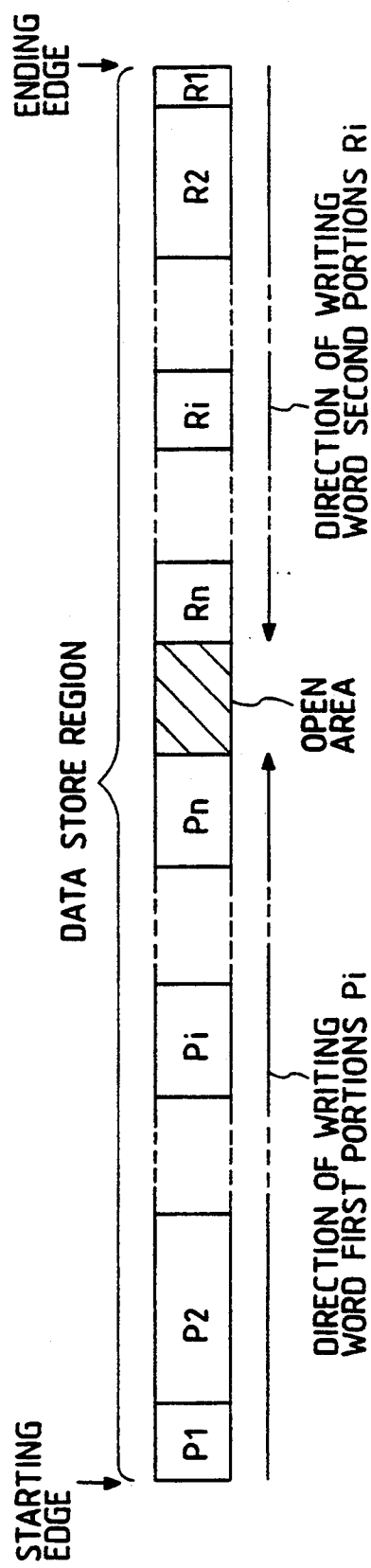
FIG. 7 is a diagram showing an example of the arrangement of variable-length code words in a data store region in the fourth embodiment of this invention.

FIG. 7 shows an example of conditions of the arrangement of variable-length code words in the data store region within the data transmission format. Each variable-length code word Ci is divided into a first portion Pi and a second portion Ri. The first portion Pi of a variable-length code word Ci includes a bit pattern from which the code length L (L=L1+L2) of the word Ci can be detected. Specifically, the first portion Pi of the variable-length code word Ci has L1 former bits of the word Ci. The second portion Ri of a variable-length code word Ci is equal to the remaining portion of the word Ci which has the L2 remaining bits of the word Ci. In FIG. 7, "n" variable-length code words Ci (i=1, 2, 3, . . . , n) are arranged in the data store region. As shown in FIG. 7, the first portions Pi (P1, P2, . . . , Pn) and the second portions Ri (R1, R2, . . . , Rn) of the respective words Ci are arranged in the data store region. The first portions Pi (P1, P2, . . . , Pn) and the second portions Ri (R1, R2, . . . , Rn) of the respective words Ci in the data store region take a bit serial format. The first portions Pi are collected into a first group disposed in one half of the data store region, while the second portions Ri are collected into a second group disposed in the other half of the data store region. Specifically, the first portions Pi (P1, P2, ..., Pn) of the respective words Ci are sequentially arranged from the starting edge of the data store region toward the ending edge thereof, while the second portions Ri (R1, R2, ..., Rn) of the respective words Ci are sequentially arranged from the ending edge of the data store region toward the starting edge thereof.

In the encoding circuit 602 of FIG. 6(a), the ROM 606 receives the input data Di via the input terminal 601. Here, the adscript "i" denotes the order number of the related data in the arrangement within each data store region. The ROM 606 encodes the input data Di into data Vi. In addition, the ROM 606 generates and outputs word length data L1 and L2 in response to the input data Di. The data Vi is in a bit parallel format, and has a code length equal to the maximum length of the variable-length code words. The variable-length code word Ci agrees with the (L1+L2) higher bits of the data Vi. The first portion Pi of the code word Ci agrees with the higher L1 bits of the data Vi, and the second portion Ri of the code word Ci agrees with the L2 following bits of the data Vi.

The shift register 607 receives the data V1 from the ROM 606. The shift register 607 converts the bit-parallel-format data V1 into corresponding bit-series format data, which is stored into the RAM 617. Since the shift register 607 sequentially outputs the bits of the data Vi in the order starting from the highest bit, the first portion Pi is written into the RAM 617 before the second portion Ri is written into the RAM 617. The RAM 617 is formed with one or more data store regions corresponding to the data store region or regions in the transmission format.

The registers 613 and 614 always hold data representing write starting addresses for the first portion Pi and the second portion Ri of a next variable-length code word. Before a first variable-length code word C1 is arranged in each data store region, the registers 613 and 614 are initialized by the control circuit 608 so that the registers 613 and 614 are loaded with data representative of the starting address of the data store region and data representative of the ending address of the data store region respectively.

When the first portion Pi is written into the RAM 617, the control circuit 608 controls the register 613, the selection circuit 615, and the counter 616 so that the contents of the data held by the resister 613 are set into the counter 616 via the selection circuit 615. Each time one bit of the first portion Pi is written into the RAM 617, the counter 616 execrates a count-up process in response to the instruction from the control circuit 608. Therefore, the first portion Pi is written and arranged into a data store region in the direction from the starting edge thereof toward the ending edge thereof. The writing of the L1 bits into the RAM 617 results in the completion of the arrangement of the first portion Pi of one variable-length code word Ci.

When the second portion Ri is written into the RAM 617, the control circuit 608 controls the register 614, the selection circuit 615, and the counter 616 so that the contents of the data held by the resister 614 are set into the counter 616 via the selection circuit 615. Each time one bit of the second portion Ri is written into the RAM 617, the counter 616 executes a count-down process in response to the instruction from the control circuit 608. Therefore, the second portion Ri is written and arranged into the data store region in the direction from the ending edge thereof toward the starting edge thereof. The writing of the L2 bits into the RAM 617 results in the completion of the arrangement of the second portion Ri of one variable-length code word Ci.

As a result of the above-mentioned processes, the arrangement of one variable-length code word Ci into the data store region is completed. Then, operation of arranging a next variable-code word into the data store region is started.

After the contents of the data held by the resister 613 are set into the counter 616, the value represented by the data in the register 613 and the word length data L1 of the first portion Pi are added by the addition circuit 609 and the result of the addition is set into the register 613. In this way, the value represented by the data in the register 613 is updated, and it now denotes the write starting address for the next first portion Pi. The control circuit 608 detects the completion of the arrangement of the first portion Pi by comparing the new contents of the data in the register 613 and the contents of the data in the counter 616.

After the contents of the data held by the resister 614 are set into the counter 616, the word length data L2 of the second portion Ri is subtracted from the value represented by the data in the register 614 by the subtraction circuit 610 and the result of the subtraction is set into the register 614. In this way, the value represented by the data in the register 614 is updated, and it now denotes the write stating address for the next second portion Ri. The control circuit 608 detects the completion of the arrangement of the second portion Ri by comparing the new contents of the data in the register 614 and the contents of the data in the counter 616.

The control circuit 608 executes the control of the writing of data into the RAM 617 and also the updating of the data in the registers 613 and 614. After the control circuit 608 updates the data in the registers 613 and 614 but before the control circuit 608 writes the first portion Pi into the RAM 617, the control circuit 608 decides whether or not a sufficient open area remains in the data store region of the RAM 617, that is, whether or not a variable-length code data can be further written into the data store region. This decision is executed by comparing the magnitude of the data in the register 613 and the magnitude of the data in the register 614. In the case where the data writing is decided to be possible, the control circuit 608 executes the writing of the variable-length code word into the data store region and subsequently executes the variable-length encoding. In addition, the control circuit 608 continues the updating of the data in the registers 613 and 614. In the case where the data writing is decided to be impossible, that is, in the case where a sufficient open area does not remain in the data store region, the control circuit 608 stops the writing of the data into the data store region and controls the counter 616 and the RAM 617 so as to output "n" variable-length code words from the data store region. In addition, the control circuit 608 executes the initialization process which sets the starting edge address and the ending edge address of the data store region into the registers 613 and 614. Furthermore, the control circuit 608 controls the counter 616 and the RAM 617 so that all the data are sequentially read out from the data store region in a bit serial format and are fed to the side information adding circuit 618.

The above-mentioned processes realize the desired arrangement of the variable-length code words (see FIG. 7). It should be noted that the control circuit 608 includes comparators (not shown) for comparing the magnitudes of the data in the registers 613 and 614 and the counter 616, and also a counter (not shown) for counting the number of the variable-length code words in the data store region.

The side information adding circuit 618 receives the bit sequence from the RAM 617. The bit sequence is equal to bit-serial data in the given transmission format having the data store region in which the variable-length code words are arranged. The side information adding circuit 618 receives the data "n" from the control circuit 608. The data "n" has a given fixed word length and represents the total number of the variable-length codes words in the data store region. The side information adding circuit 618 adds the data "n" into a given location of the transmission format as the side information.

The reason why the number "n" of the variable-length code words in each data store region is transmitted as the side information will be described hereinafter. In general, variable-length code words have different word lengths, so that data store regions have different numbers of variable-length code words. Most of data store regions have an open or dead area unoccupied by any variable-length code word. Thus, the decoding generally requires information which represents the positions of the boundaries between the open area and the occupied areas in each data store region. In this embodiment, the side information, that is, the data "n" representing the number of variable-length code words, corresponds to such information of boundary positions.

Figure 6B:
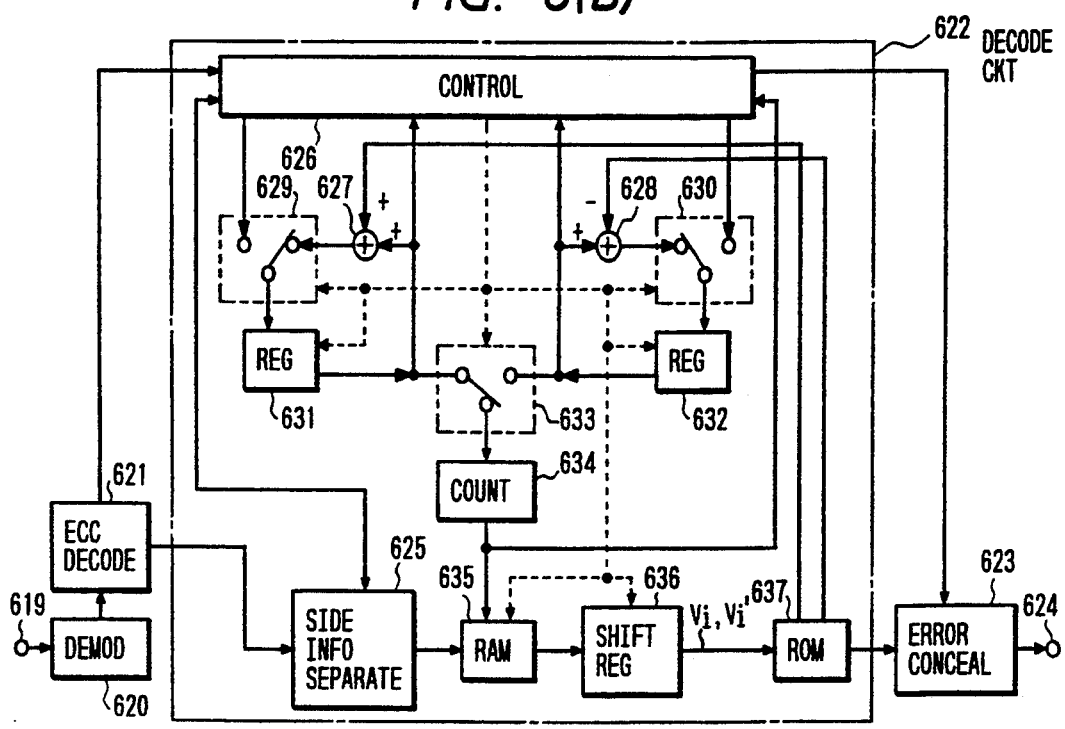
FIG. 6(b) is a block diagram of a receiver using a decoding method according to the fourth embodiment of this invention.

FIG. 6(b) shows a receiver using a decoding method according to the fourth embodiment of this invention. With reference to FIG. 6(b), an input terminal 619 is subjected to an input signal which is fed from the transmitter of FIG. 6(a) via the transmission line.

As shown in FIG. 6(b), the receiver includes a demodulation circuit 620, an ECC decoder 621, a decoding circuit 622, and an error concealment circuit 623. The demodulation circuit 620 receives the input signal via the input terminal 619, and subjects the input signal to a demodulation process. The ECC decoder 621 receives the output data from the demodulation circuit 620, and corrects transmission errors in the data. The decoding circuit 622 receives the output data from the ECC decoder 621. The decoding circuit 622 takes variable-length code words out of each data store region in the transmission format of the data, and thereby recovers data Di. The error concealment circuit 623 conceals or corrects transmission errors in the data Di, and thereby generates error-concealed data. The error concealment circuit 623 outputs the error-concealed data, which is transmitted via an output terminal 624.

As shown in FIG. 6(b), the decoding circuit 622 includes a side information separating circuit 625, a control circuit 626, an addition circuit 627, a subtraction circuit 628, a selection circuit 629, a selection circuit 630, a register 631, a register 632, a selection circuit 633, a counter 634, a RAM (a random access memory) 635, a shift register 636, and a ROM (a read only memory) 637. The side information separating circuit 625 separates the side information from the output data of the ECC decoder 621. The selection circuits 629 and 630 are controlled by the control circuit 626. Each of the selection circuits 629 and 630 selects and outputs one of two signals inputted thereto. The selection circuit 633 is controlled by the control circuit 626. The selection circuit 633 selects and outputs one of two input signals inputted thereinto. The counter 634 is controlled by the control circuit 626, incrementing or decrementing a count value by 1. The RAM 635 receives the output signal from the counter 634 is an address signal. The RAM 635 serves to store the output data from the side information separating circuit 625. The shift register 636 receives the bit-serial-format data from the RAM 635, and converts the received data into data Vi' and Vi of a fixed-word-length parallel format. The ROM 637 executes a decoding process. The ROM 637 receives the data Vi' and Vi, and generates and outputs recovered data Di and word length data L1 and L2 in accordance with the received data Vi' and Vi.

The receiver of FIG. 6(b) operates as follows. The demodulation circuit 620 receives the input signal via the input terminal 619, and subjects the input signal to a demodulation process. The ECC decoder 621 receives the output data from the demodulation circuit 620, and corrects transmission errors in the data. The decoding circuit 622 receives the output data from the ECC decoder 621. The decoding circuit 622 takes variable-length code words out of each data store region in the transmission format of the data, and thereby recovers data Di. The error concealment circuit 623 receives the recovered data Di from the decoding circuit 622. The error concealment circuit 623 corrects or conceals transmission errors in the data Di, and thereby generates error-concealed data. The error concealment circuit 623 outputs the error-concealed data, which is transmitted via the output terminal 624. The error concealment circuit 623 is activated only in the presence of a transmission error which can not be directly corrected by the ECC decoder 621. Specifically, in the presence of error data which can not be recovered due to an error, the error concealment circuit 623 estimates recovered data corresponding to the error data through an interpolation process using recovered data in positions adjacent to the position corresponding to the error data, and then places the estimated recovered data into the position corresponding to the error data. The error concealment circuit 623 may generate inconspicuous data (for example, data representing "0") and place the inconspicuous data into the position corresponding to the error data.

The operation of the decoding circuit 622 will now be explained in more detail. As described previously, each variable-length code word Ci is divided into a first portion Pi and a second portion P2 which are located in a data store region. The decoding circuit 622 takes variable-length code words Ci out of each data store region, and decodes the variable-length code words Ci into corresponding data Di. The side information separating circuit 625 receives the output data from the ECC decoder 621. The side information separating circuit 625 separates the received data into the side information and the other information. The side information is the data "n" representing the number of variable-length code words in a data store region. The side information separating circuit 625 outputs the data "n" to the control circuit 626. The side information separating circuit 625 outputs the serial data to the RAM 635. The serial data is sequentially written into a data store region in the RAM 635 in a order from the starting edge to the ending edge of tile data store region.

The serial data, that is, the variable-length code words Ci, is read out from the data store region in the RAM 635 as follows. The registers 631 and 632 always hold data representing read starting addresses for the first portion Pi and the second portion Ri of a variable-length code word. Before a first variable-length code word C1 is read out from each data store region, the registers 631 and 632 are initialized by the control circuit 626 so that the registers 631 and 632 are loaded with data representative of the starting address of the data store region and data representative of the ending address of the data store region respectively.

The control circuit 626 controls the register 631, the selection circuit 633, and the counter 634 so that the value represented by the data in the register 631 is set into the counter 634 via the selection circuit 633. The data Vi' corresponding to the maximum word length of a variable-length code word is read out from the data store region in the RAM 635 while the value represented by the data in the counter 634 is incremented each time 1-bit data is read out from the data store region in the RAM 635. The shift register 636 receives the bit-serial-format data read out from the RAM 635. The shift register 636 converts the bit-serial-format data into corresponding bit-parallel-format data Vi'.

The ROM 637 receives the data Vi', and generates and outputs recovered data and word length data L1 and L2 in accordance with the data Vi'. Since the data Vi' differs from the data Vi in the transmitter, the entire of correct data can not be recovered at this stage. Since the data Vi' has a first portion Pi equal to the first portion in the data Vi, correct word length data L1 and L2 cam be recovered at this stage.

The data Vi is recovered by using the data L1 and L2 as follows. The control circuit 626 controls the register 631, the selection circuit 633, and the counter 634 so that the value represented by the data in the register 631 is set into the counter 634 via the selection circuit 633. The address value represented by the data in the counter 634 is incremented for each bit, and thereby L1-bit data is read out from the RAM 635 and is fed to the shift register 636 in a bit serial format. As a result, the first portion Pi of the variable-length code word has been read out from the RAM 635.

Then, the control circuit 626 controls the register 632, the selection circuit 633, and the counter 634 so that the value represented by the data in the register 632 is set into the counter 634 via the selection circuit 633. The address value represented by the data in the counter 634 is decremented for each bit, and thereby (Lmax-L1)-bit data is read out from the RAM 635 and is fed to the shift register 636 in a bit serial format. Here, the character Lmax denotes the maximum word length of variable-length code words. As a result, the second portion Ri of the variable-length code word has been read out from the RAM 635.

The shift register 636 receives the bit-serial-format data from the RAM 635, and converts the received data into corresponding bit-parallel-format data Vi. The shift register 636 outputs the bit-parallel-format data Vi to the ROM 637. The reason why the total number of bits read out for each word is set to Lmax={L1+(Lmax-L1)} rather than (L1+L2) is that the first bit of the readout variable-length code word is held placed in the highest bit of a signal inputted into the ROM 637. Thereby, the ROM 637 converts the data Vi into correct recovered data Di. In this way, the decoding of one variable-length code word is completed.

It is necessary to update the data in the registers 631 and 632 which represent read addresses for the first portion Pi and the second portion Ri of a next variable-length code word. The value represented by the data in the register 631 and the word length data L1 for the fist portion Pi are added by the addition circuit 627, and the result of the addition is set into the register 631 so that the data in the register 631 is updated. The subtraction between the value represented by the data In the register 632 and the word length data L2 for the second portion Pd is executed by the subtraction circuit 628, and the result of the subtraction is set into the register 632 so that the data in the register 632 is updated.

The control circuit 626 counts the number of the decoded variable-length code words in each data store region. Until the counted number, that is, the number of the decoded variable-length code words, reaches the number represented by the data "n", the control circuit 626 operates to continue the decoding process. When the counted number reaches the number "n", the control circuit 626 interrupts the decoding process. Then, the control circuit 626 enables the writing of data from a next data store region into the RAM 635 to start the decoding process on the data in the next data store region.

The above-mentioned processes are reiterated until the decoding of all the data is completed.

A description will now be given of a case where a transmission error occurs in the arrangement of variable-length code words in a data store region. It is assumed that the transmission error occurs in one bit. In addition, an introduction is given of the general presumption that the probabilities of the occurrence of an error in the respective bit positions in a data store region are equal.

A calculation is done regarding the number M1 of variable-length code words which can be decoded into correct data when a 1-bit error occurs in an area containing the first portion Pi of a variable-length code word. In the case, where an error occurs in the first portion Pk of the k-th variable, length code word, the k-th variable-length code word and later variable-length code words can not be decoded into correct data for the reason as follows. The word length of the k-th variable-length code word is detected on the basis of the first portion Pk thereof. If an error occurs in the first portion Pk, the word length of the k-th variable-length code word can not be accurately detected and thus the word lengths of later variable-length code words can not be accurately detected. When k=1, there is no variable-length code word which can be decoded into correct data. When k=n, the number of variable-length code words which can be decoded into correct data is equal to (n−1). Thus, in the presence of a 1-bit error in a first portion Pi, the average of the number M1 of variable-length code words which can be decoded into correct data is equal to (n−1)/2.

A calculation is done regarding the number M2 of variable-length code words which can be decoded into correct data when a 1-bit error occurs in an area containing the second portion Ri of a variable-length code word. In the case where an error occurs in the second portion Rk of the k-th variable-length code word, only the k-th variable-length code word can not be decoded into correct data for the reason as follows. The word length of the k-th variable-length code word is detected independent of the second portion Rk thereof, and the error does not affect the other variable-length code words. Thus, in the presence of a 1-bit error in a second portion Ri, the number M2 of variable-length code words which can be decoded into correct data is equal to (n−1).

The ratio of the total area occupied by first portions Pi (i=1, 2, ..., n) to the entire area of a data store region is now represented by "x", where $0 \leq x \leq 1$. In the presence of a 1-bit error in the data store region, the error exists in the first portions Pi at a probability equal to "x" while the error exists in the second portions Ri at a probability equal to (1−x). Accordingly, in the case where a 1-bit error occurs in the data store region, the average number M of variable-length code words which can be decoded into correct data is given as follows.

$$M = x \cdot M1 + (1-x) \cdot M2 = (n-1) \cdot (1-x/2) \qquad (13)$$

Figure 8:
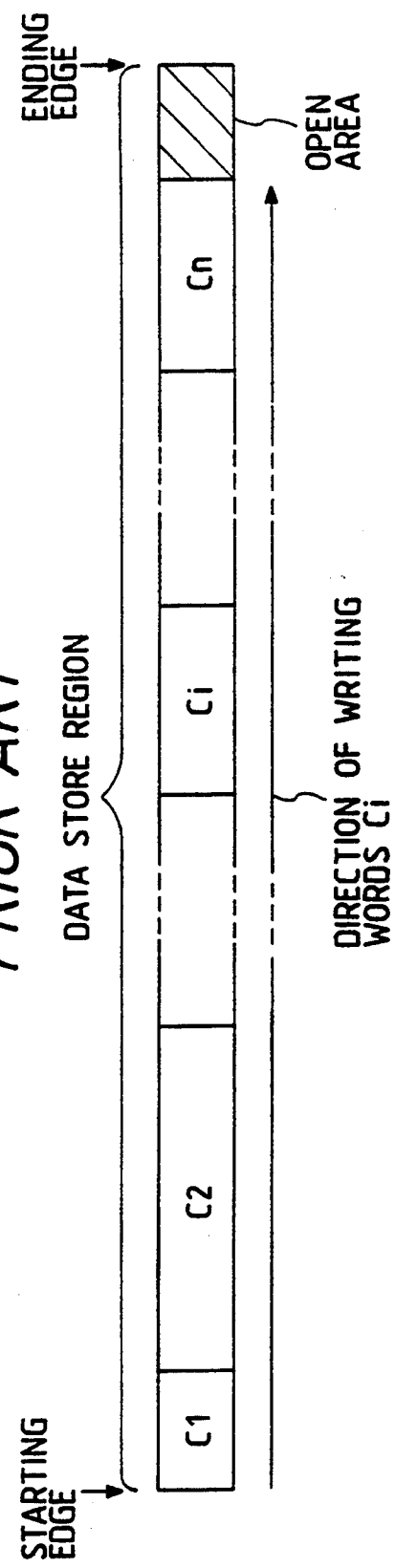
FIG. 8 is a diagram showing an example of the arrangement of variable-length code words in a data store region according to a prior-art design.

On the other hand, according to a prior-art encoding/decoding method using the arrangement of variable-length code words shown in FIG. 8, the average number "m" of variable-length code words which can be decoded into correct data is equal to (n−1)/2 in the presence of a 1-bit error since the variable-length code word containing the error and later variable-length code words can not be decoded into correct data.

The average number "m" is equal to the average number M which occurs when x=1. In general, the value "x" is less than 1, and the average number M is greater than the average number "m". Accordingly, this embodiment can decode more variable-length code words into correct data than those in the prior-art encoding/decoding method. For example, in the case where this embodiment uses a Wyle code as the variable-length code, the minimum value of "x" is approximately equal to 0.6 so that the number of variable-length code words which can be decoded into correct data is greater than that in the prior-art encoding/decoding method by about 40%.

As shown in FIG. 7, the position of starting the arrangement of second portions Ri is set coincident with the ending edge of a data store region, and the second portions Ri are arranged in the order opposite to the order of the arrangement of first portions Pi. The reason for this arrangement of the first portions Pi and the second portions Ri is that the positions of heads thereof can be fixed and unchanged independent of transmission errors. In an assumed case where a second portion Ri is arranged into a position immediately following a first portion Pi and second portions Ri are arranged in an order equal to the order of the arrangement of first portions Pi, the position of a head thereof tends to be unknown and accurate decoding is more difficult if a transmission error occurs.

According to the arrangement of variable-length code words shown in FIG. 7, first portions Pi arc separated from second portions R1, and the first portions Pi are placed together in a first group while the second portions Pd are placed together in a second group. This separating arrangement is adopted in view of the fact that an error can propagate trough the first portions Pi and an error can not propagate through the second portions Ri. Thus, the ECC encoder 603 of FIG. 6(a) can add error correction codes of higher ability to error-propagatable data portions then the ability of error correction codes added to other data portions. This design further increase the average number of variable-length code words which can be decoded into correct data in the presence of a transmission error. It is preferable that the data portions which are made higher in error-correction ability agree with the first portions Pi. It may also be good that the data portions which are made higher in error-correction ability do not exactly agree with the first portions Pi. For example, the data portions which are made higher in error-correction ability may agree with a given area extending from the starting edge of a data store region, for example, a given former area of the data store region.

As described previously, according to the this embodiment, it is possible to discriminate between the case where error propagation occurs and the case where error propagation does not occur without reducing the encoding efficiency. Thus, it is possible to decode more variable-length code words into correct data than those in the prior-art encoding/decoding method.

It is preferable that a first portion Pi is limited to a smallest portion which enables the determination of the word length of a variable-length code word. This design minimizes the area occupied by first portions which can undergo error propagation, and thus minimizes the value "x" so that it is possible to withstand an error at a highest degree.

This embodiment may use other variable-length codes or codes composed of the combination of a plurality of variable-length codes.

This embodiment may have other structures and other arrangements of variable-length code words into a data store region. According to a first example of the other arrangements of variable-length code words into a data store region, the directions of bit sequences in the second portions Ri of code words are set opposite to the direction of the second portions Ri in the data store region. It should be noted that, in FIG. 7, the directions of bit sequences in the second portions Ri of code words are set equal to the direction of the second portions Ri in the data store region. According to a second example of the other arrangements of variable-length code words into a data store region, first portions Pi and second portions Ri are arranged in separate data store regions. In this case, the directions of arrangements thereof can be set freely.

In this embodiment, the side information is used for detecting the boundary between a first portion Pi and a second portion Ri or detecting an open area in the data store region, and the side information is composed of data representing the number of variable-length code words in the data store region. The side information may use other data such as data representing the position of the boundary between a first portion Pi and a second portion Ri, or data representing the number of bits of an open area in the data store region.

It may also be good that side information is not transmitted. According to an example which does not transmit side information, a code word representing the end of data is added to the ending edge of a first portion Pi. According to another example which does not transmit side information, the former S bits of a variable-length code word having bits more than S are placed into an S-bit open area between the area containing first portions Pi and the area containing second portions Ri. When the S-bit portion is intended to be decoded to recover the (n+1)-th code word, the value represented by the data in the register 631 is greater than the value represented by the data in the register 632. This fact means that data of the (n+1)-th code word lacks, and it is understood that the final code word is the n-th code word.

It is good that the data quantity and the boundary with respect to a data store region are determined uniquely. It may be good that the data capacity of a data store region is variable. It is unnecessary that a data store region always agrees with a physical data store region (for example, a data region in a packet in the case of packet transmission, or a data region in a sector in the case of a disk-shaped recording medium) in a transmission format. This embodiment can be applied to a transmission format where fixed-length data is arranged in a given area within a data store region, provided that the area containing the fixed-length data is removed from the data store region and the resultant data store region is newly defined as a continuous data store region.

What is claimed is:

1. A method of efficient encoding, comprising the steps of:
    generating an estimate of input data;
    calculating an estimation error which is equal to a difference between the estimate and the input data;
    classifying the estimation error and generating a category index indicative of a category corresponding to the estimation error;
    dividing the input data by a divisor and generating a remainder of a result of the dividing the divisor being equal to a given value which is greater than a difference between an upper limit value and a lower limit value defining a range of the category; and
    encoding the category index and the remainder into corresponding codes and outputting the codes.

2. The method of claim 1, wherein the divisor is equal to 1 plus the difference between the upper limit value and the lower limit value, and the upper limit value and the lower limit value of the category are chosen so that the divisor is equal to a power of 2.

3. The method of claim 1, wherein the encoding and outputting step comprises the sub steps of subjecting the category index to entropy encoding, and encoding the remainder into a code of a length which is variable in accordance with a magnitude of the divisor.

4. The method of claim 1, wherein the encoding and outputting step comprises the sub step of directly encoding the input data and outputting a result of the encoding of the input data in cases where the estimation error corresponds to one of a category related to a maximum estimation error and a category related to a minimum estimation error.

5. A method of decoding, comprising the steps of:
    decoding input data into a category index and a remainder;
    generating an estimate from previous output data;
    generating a divisor in accordance with the category index;
    generating an offset in accordance with the divisor and the estimate, the offset being equal to the divisor multiplied by an integer; and
    adding the offset and the remainder and thereby generating new output data in accordance with the offset and the remainder;
    wherein the estimate-generating step comprises the sub step of, in the presence of a control signal, generating the estimate by a prediction process which differs from a prediction process in an encoding side, and wherein the offset-generating step comprises the sub step of, in the presence of the control signal, generating the offset so as to increase a correlation between output data and the estimate.

6. A method of efficient encoding, comprising the steps of:
    collecting a given number of bits of input data into a block;
    subjecting the input data in a block to given transform and thereby generating a DC coefficient and AC coefficients from the input data in a block;
    quantizing the DC coefficient into data D;
    encoding the data D into Coded DC data;
    quantizing the AC coefficients: and
    encoding results of quantizing the AC coefficients into Coded AC data;
    wherein the data-D encoding step comprises the sub steps of generating an estimate of the data D, generating an estimation error which is equal to a difference between the data D and the estimate, classifying the estimation error and generating a category index indicative of a category corresponding to the estimation error, determining a divisor in accordance with the category corresponding to the estimation error, dividing the data D by the divisor and generating a remainder of a result of the dividing, and encoding the category index and the remainder and thereby generating the Coded DC data in accordance with the category index and the remainder.

7. A method of decoding, comprising the steps of:
    decoding Coded AC data into quantized AC coefficients;
    decoding Coded DC data into a quantitized DC coefficient;
    dequantizing the quantized AC coefficients into AC coefficients;
    dequantizing the quantized DC coefficient into a DC coefficient;
    subjecting the AC coefficients and the DC coefficient to inverse transform and thereby generating first decoded data in a block in accordance with the AC coefficients and the DC coefficient; and
    rearranging the first decoded .data in a block into second decoded data which has a data arrangement corresponding to a data arrangement of input data to be encoded in an encoding side;
    wherein the Coded-DC-data decoding step comprises the sub steps of decoding the Coded DC data :into a category index and a remainder, generating an estimate in accordance with decoded quantized data, generating a divisor in accordance with the category index, generating an offset in accordance with the divisor and the estimate, the offset being equal to the divisor multiplied by an integer, adding the offset and the remainder and thereby generating new quantized data in accordance with the offset and the remainder;
    wherein the estimate-generating step comprises the sub step of, in the presence of a control signs, generating the estimate by a prediction process which differs from a prediction process in an encoding side, and wherein the offset-generating step comprises the sub step of, in the presence of the control signal, generating the offset so as to increase a correlation between decoded data in a block being currently decoded and decoded data in an error-free block adjoining the block being currently decoded.

8. A method of efficient encoding, comprising the steps of encoding input data into a variable-length code, and arranging the variable-length code into a data store region of a given capacity and outputting the variable-length code, the improvement comprising the steps of:

encoding the input data into variable-length code words each having a first portion and a second portion, wherein the first portion of each code word includes a bit pattern which can determine a code length of said each code word, and wherein the second portion is equal to a part of said each code word except the first portion;

collecting the first portions into a group and arranging the group of the first portions into the data store region; and collecting he second portions into a group and arranging the group of the second portions into the data store region.

9. The method of clam 8, further comprising the step of adding an error correction code into the variable-length code words so that an ability of error correction with respect to the first portions in the data store region is higher than an ability of error correction with respect to the second portions in the data store region.

10. The method of claim 8, wherein the first-portion collecting and arranging step comprises the sub step of sequentially arranging the first portions in a direction from a first edge of the data store region toward a second edge of the data store region, and wherein the second-portion collecting and arranging step comprises the sub step of sequentially arranging the second portions in a direction from the second edge of the data store region toward the first edge of the data store region.

11. The method of claim 8, wherein the first portion consists of a minimum-length bit pattern which can determine a code length of said each code word.

12. The method of claim 8, wherein the first-portion collecting and arranging step comprises the sub step of finally adding a code word denoting a last variable-length code word in the data store region.

13. The method of claim 8, wherein the first-portion collecting and arranging step comprises the sub steps of cutting an S-bit former part out of a variable-length code word having a code length greater than S bits, where S denotes an integer equal to or greater than 0, and arranging the cut-out Shit former part into an S-bit open area in the data store region which extends between an area containing the first portions and an area containing the second portions.

14. An apparatus for efficient encoding, comprising:
means for generating an estimate of input data;
means for calculating an estimation error which is equal to a difference between the estimate and the input data;
means for classifying the estimation error and generating a category index indicative of a category corresponding to the estimation error;
means for dividing the input data by a divisor and generating a remainder of a result of the dividing, the divisor being equal to a given value which is greater than a difference between an upper limit value and a lower limit value defining a range of the category; and
means for encoding the category index and the remainder into corresponding codes and outputting the codes.

15. The apparatus of claim 14, wherein the divisor is equal to 1 plus the difference between the upper limit value and the lower limit value, and the upper limit value and the lower limit value of the category are chosen so that the divisor is equal to a power of 2.

16. The apparatus of claim 14, wherein the encoding and outputting means comprises means for subjecting the category index to entropy encoding, and means for encoding the remainder into a code of a length which is variable in accordance with a magnitude of the divisor.

17. The apparatus of claim 14, wherein the encoding and outputting means comprises means for directly encoding the input data and outputting a result of the encoding of the input data in cases where the estimation error corresponds to one of a category related to a maximum estimation error and a category related to a minimum estimation error.

18. An apparatus for decoding, comprising:
means for decoding input data into a category index and a remainder;
means for generating an estimate from previous output data;
means for generating a divisor In accordance with the category index;
means for generating an offset in accordance with the divisor and the estimate, the offset being equal to the divisor multiplied by an integer; and
means for adding the offset and the remainder and thereby generating new output data in accordance with the offset and the remainder;
wherein the estimate-generating means comprises means for, in the presence of a control signal, generating the estimate by a prediction process which differs from a prediction process in an encoding side, and wherein the offset-generating means comprises means for, in the presence of the control signal, generating the offset so as to increase a correlation between output data and the estimate.

19. An apparatus for efficient encoding, comprising:
means for collecting a given number of bits of input data into a block;
means for subjecting the input data in a block to given transform and thereby generating a DC coefficient and AC coefficients from the input data in a block;
means for quantizing the DC coefficient into data D;
means for encoding the data D into Coded DC data;
means for quantizing the AC coefficients; and
means for encoding results of quantizing the AC coefficients into Coded AC data;
wherein the data-D encoding means comprises means for generating an estimate of the data D, means for generating an estimation error which is equal to a difference between the data D and the estimate, means for classifying the estimation error and generating a category index indicative of a category corresponding to the estimation error, means for determining a divisor in accordance with the category corresponding to the estimation error, means for dividing the data D by the divisor and generating a remainder of a result of the dividing, and means for encoding the category index and the remainder and thereby generating the Coded DC data in accordance with the category index and the remainder.

20. An apparatus for decoding, comprising:
means for decoding Coded AC data into quantized AC coefficients;
means for decoding Coded DC data into a quantized DC coefficient;
means for dequantizing the quantized AC coefficients into AC coefficients;

means for dequantizing the quantized DC coefficient into a DC coefficient;

means for subjecting the AC coefficients and the DC coefficient to inverse transform and thereby generating first decoded data in a block in accordance with the AC coefficients and the DC coefficient; and means for rearranging the first decoded data in a block into second decoded data which has a data arrangement corresponding to a data arrangement of input data to be encoded in an encoding side;

wherein the Coded-DC-data decoding means comprises means for decoding the Coded DC data into a category index and a remainder, means for generating an estimate in accordance with decoded quantized data, means for generating a divisor in accordance with the category index, means for generating an offset in accordance with the divisor and the estimate, the offset being equal to the divisor multiplied by an integer, means for adding the offset and the remainder and thereby generating new quantized data in accordance with the offset and the remainder;

wherein the estimate-generating means comprises means for, in the presence of a control signal, generating the estimate by a prediction process which differs from a prediction process in an encoding side, and wherein the offset-generating means comprises means for, in the presence of the control signal, generating the offset so as to increase a correlation between decoded data in a block being currently decoded and decoded data in an error-free block adjoining the block being currently decoded.

21. An apparatus for efficient encoding, comprising means for encoding input data into a variable-length code, and means for arranging the variable-length code into a data store region of a given capacity and outputting the variable-length code, the improvement comprising:

means for encoding the input data into variable-length code words each having a first portion and a second portion, wherein the first portion of each code word includes a bit pattern which can determine a code length of said each code word, and wherein the second portion is equal to a part of said each code word except the first portion:

means for collecting the first portions into a group and arranging the group of the first portions into the data store region; and means for collecting the second portions into a group and arranging the group of the second portions into the data store region.

22. The apparatus of claim 21, further comprising means for adding an error correction code into the variable-length code words so that an ability of error correction with respect to the first portions in the data store region is higher than an ability of error correction with respect to the second portions in the data store region.

23. The apparatus of claim 21, wherein the first-portion collecting and arranging means comprises means for sequentially arranging the first portions in a direction from a first edge of the data store region toward a second edge of the data store region, and wherein the second-portion collecting and arranging means comprises means for sequentially arranging the second portions in a direction from the second edge of the data store region toward the first edge of the data store region.

24. The apparatus of claim 21, wherein the first portion consists of a minimum-length bit patter which can determine a code length of said each code word.

25. The apparatus of claim 21, wherein the first-portion collecting and arranging means comprises means for finally adding a code word denoting a last variable-length code word in the data store region.

26. The apparatus of claim 21, wherein the first-portion collecting and arranging means comprises means for cutting an S-bit former part out of a variable-length code word having a code length greater than S bits, where S denotes an integer equal to or greater than 0, and means for arranging the cut-out S-bit former part into an S-bit open area in the data store region which extends between an area containing the first portions and an area containing the second portions.

* * * * *

UNITED STATES PATENT AND TRADEMARK OFFICE
CERTIFICATE OF CORRECTION

PATENT NO. : 5,392,037
DATED : February 21, 1995
INVENTOR(S) : Shiro KATO

It is certified that error appears in the above-indentified patent and that said Letters Patent is hereby corrected as shown below:

On title page, delete item [30] and replace it with the following:

--[30]  Foreign Application Priority Data

| May 21, 1991 | [JP] | Japan | . . . . . . . 3-116008 |
| Aug. 13, 1991 | [JP] | Japan | . . . . . . . 3-202847 |
| Feb. 21, 1992 | [JP] | Japan | . . . . . . 4-34659-- |

Signed and Sealed this

Twenty-fifth Day of April, 1995

Attest:

BRUCE LEHMAN

*Attesting Officer*     *Commissioner of Patents and Trademarks*